(12) United States Patent
Cortie et al.

(10) Patent No.: US 10,209,624 B2
(45) Date of Patent: *Feb. 19, 2019

(54) FLUID HANDLING STRUCTURE, LITHOGRAPHIC APPARATUS AND DEVICE MANUFACTURING METHOD

(71) Applicant: ASML NETHERLANDS B.V., Veldhoven (NL)

(72) Inventors: Rogier Hendrikus Magdalena Cortie, Ittervoort (NL); Paulus Martinus Maria Liebregts, Veldhoven (NL); Michel Riepen, Veldhoven (NL); Fabrizio Evangelista, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 15/838,634

(22) Filed: Dec. 12, 2017

(65) Prior Publication Data

US 2018/0101102 A1 Apr. 12, 2018

Related U.S. Application Data

(63) Continuation of application No. 15/016,041, filed on Feb. 4, 2016, now Pat. No. 9,846,372, which is a (Continued)

(51) Int. Cl.
*G03F 7/20* (2006.01)

(52) U.S. Cl.
CPC .............................. *G03F 7/70341* (2013.01)

(58) Field of Classification Search
CPC .................................................. G03F 7/70341
See application file for complete search history.

(56) References Cited

U.S. PATENT DOCUMENTS

| | | |
|---|---|---|
| 3,573,975 A | 4/1971 | Dhaka et al. |
| 3,648,587 A | 3/1972 | Stevens |

(Continued)

FOREIGN PATENT DOCUMENTS

| | | |
|---|---|---|
| CN | 1892438 | 1/2007 |
| CN | 101452218 | 6/2009 |

(Continued)

OTHER PUBLICATIONS

European Search Report dated Jun. 7, 2011 in corresponding European Patent Application No. EP 11 15 6770

(Continued)

*Primary Examiner* — Michelle M Iacoletti
(74) *Attorney, Agent, or Firm* — Pillsbury Winthrop Shaw Pittman, LLP

(57) ABSTRACT

A fluid handling structure for a lithographic apparatus is disclosed, the fluid handling structure successively has, at a boundary from a space configured to contain immersion fluid to a region external to the fluid handling structure: an elongate opening or a plurality of openings arranged in a first line that, in use, are directed towards a substrate and/or a substrate table configured to support the substrate; a gas knife device having an elongate aperture in a second line; and an elongate opening or a plurality of openings adjacent the gas knife device.

20 Claims, 7 Drawing Sheets

Related U.S. Application Data continuation of application No. 13/090,311, filed on Apr. 20, 2011, now Pat. No. 9,256,136.

(60) Provisional application No. 61/362,961, filed on Jul. 9, 2010, provisional application No. 61/326,972, filed on Apr. 22, 2010.

(56) References Cited

U.S. PATENT DOCUMENTS

| | | | |
|---|---|---|---|
| 4,346,164 A | 8/1982 | Tabarelli et al. | |
| 4,390,273 A | 6/1983 | Loebach et al. | |
| 4,396,705 A | 8/1983 | Akeyama et al. | |
| 4,441,808 A | 4/1984 | Giacomelli | |
| 4,480,910 A | 11/1984 | Takanashi et al. | |
| 4,509,852 A | 4/1985 | Tabarelli et al. | |
| 4,778,995 A | 10/1988 | Kulpinski et al. | |
| 4,801,352 A | 1/1989 | Piwczyk | |
| 4,980,896 A | 12/1990 | Forsyth et al. | |
| 5,040,020 A | 8/1991 | Rauschenbach et al. | |
| 5,103,102 A | 4/1992 | Economou et al. | |
| 5,121,256 A | 6/1992 | Corle et al. | |
| 5,174,829 A | 12/1992 | Gray | |
| 5,528,100 A | 6/1996 | Igeta et al. | |
| 5,610,683 A | 3/1997 | Takahashi | |
| 5,668,672 A | 9/1997 | Oomura | |
| 5,689,377 A | 11/1997 | Takahashi | |
| 5,715,039 A | 2/1998 | Fukuda et al. | |
| 5,825,043 A | 10/1998 | Suwa | |
| 5,835,275 A | 11/1998 | Takahashi | |
| 5,871,584 A | 2/1999 | Tateyama et al. | |
| 5,874,820 A | 2/1999 | Lee | |
| 5,900,354 A | 5/1999 | Batchelder | |
| 5,997,963 A | 12/1999 | Davison | |
| 6,126,169 A | 10/2000 | Sogard et al. | |
| 6,191,429 B1 | 2/2001 | Suwa | |
| 6,230,722 B1 | 5/2001 | Mitsumori et al. | |
| 6,236,634 B1 | 5/2001 | Lee et al. | |
| 6,438,074 B1 | 8/2002 | Aki et al. | |
| 6,488,040 B1 | 12/2002 | De Larios et al. | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,867,844 B2 | 3/2005 | Vogel et al. | |
| 6,952,253 B2 | 10/2005 | Lof et al. | |
| 6,954,256 B2 | 10/2005 | Flagello et al. | |
| 7,009,682 B2 | 3/2006 | Bleeker | |
| 7,050,146 B2 | 5/2006 | Duineveld et al. | |
| 7,075,616 B2 | 7/2006 | Derksen et al. | |
| 7,081,943 B2 | 7/2006 | Lof et al. | |
| 7,193,232 B2 | 3/2007 | Lof et al. | |
| 7,199,858 B2 | 4/2007 | Lof et al. | |
| 7,326,522 B2 | 2/2008 | Dierichs | |
| 7,339,650 B2 | 3/2008 | Coon et al. | |
| 7,352,434 B2 | 4/2008 | Streefkerk et al. | |
| 7,359,030 B2 | 4/2008 | Simon et al. | |
| 7,808,614 B2 | 10/2010 | Luijten et al. | |
| 7,834,974 B2 | 11/2010 | Kemper et al. | |
| 7,907,251 B2 | 3/2011 | Hasegawa | |
| 8,144,305 B2 | 3/2012 | Leenders et al. | |
| 8,218,126 B2 | 7/2012 | Steffens et al. | |
| 8,351,018 B2 | 1/2013 | Direcks et al. | |
| 8,587,762 B2 | 11/2013 | Streefkerk et al. | |
| 8,614,784 B2 * | 12/2013 | Riepen | G03F 7/70341 355/30 |
| 8,902,400 B2 | 12/2014 | Lafarre et al. | |
| 9,256,136 B2 * | 2/2016 | Cortie | G03F 7/70341 |
| 9,846,372 B2 * | 12/2017 | Cortie | G03F 7/70341 |
| 2001/0037819 A1 | 11/2001 | Mitsumori et al. | |
| 2002/0008118 A1 | 1/2002 | Cavallaro | |
| 2002/0016082 A1 | 2/2002 | Mertens et al. | |
| 2002/0020821 A1 | 2/2002 | Van Santen et al. | |
| 2002/0025687 A1 | 2/2002 | Zahorik et al. | |
| 2002/0163629 A1 | 11/2002 | Switkes et al. | |
| 2003/0030916 A1 | 2/2003 | Suenaga | |
| 2003/0123040 A1 | 7/2003 | Almogy | |
| 2003/0174408 A1 | 9/2003 | Rostalski et al. | |
| 2004/0000627 A1 | 1/2004 | Schuster | |
| 2004/0021844 A1 | 2/2004 | Suenaga | |
| 2004/0069329 A1 | 4/2004 | De Larios et al. | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik et al. | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0239954 A1 | 12/2004 | Bischoff | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0007569 A1 | 1/2005 | Streefkerk et al. | |
| 2005/0018155 A1 | 1/2005 | Cox et al. | |
| 2005/0024609 A1 | 2/2005 | De Smit et al. | |
| 2005/0030497 A1 | 2/2005 | Nakamura | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048223 A1 | 3/2005 | Pawloski et al. | |
| 2005/0052632 A1 | 3/2005 | Miyajima | |
| 2005/0068499 A1 | 3/2005 | Dodoc et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0094125 A1 | 5/2005 | Arai | |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0122505 A1 | 6/2005 | Miyajima | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0140948 A1 | 6/2005 | Tokita | |
| 2005/0141098 A1 | 6/2005 | Schuster | |
| 2005/0145803 A1 | 7/2005 | Hakey et al. | |
| 2005/0146693 A1 | 7/2005 | Ohsaki | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0151942 A1 | 7/2005 | Kawashima | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0200815 A1 | 9/2005 | Akamatsu | |
| 2005/0205108 A1 | 9/2005 | Chang et al. | |
| 2005/0213061 A1 | 9/2005 | Hakey et al. | |
| 2005/0213065 A1 | 9/2005 | Kitaoka | |

(56) References Cited

U.S. PATENT DOCUMENTS

| | | | |
|---|---|---|---|
| 2005/0213066 | A1 | 9/2005 | Sumiyoshi |
| 2005/0213072 | A1 | 9/2005 | Schenker et al. |
| 2005/0217135 | A1 | 10/2005 | O'Donnell et al. |
| 2005/0217137 | A1 | 10/2005 | Smith et al. |
| 2005/0217703 | A1 | 10/2005 | O'Donnell |
| 2005/0219489 | A1 | 10/2005 | Nei et al. |
| 2005/0225737 | A1 | 10/2005 | Weissenrieder et al. |
| 2005/0233081 | A1 | 10/2005 | Tokita |
| 2005/0259234 | A1 | 11/2005 | Hirukawa et al. |
| 2005/0270505 | A1 | 12/2005 | Smith |
| 2005/0286032 | A1 | 12/2005 | Lof et al. |
| 2006/0012765 | A1 | 1/2006 | Kameyama |
| 2006/0023182 | A1 | 2/2006 | Novak et al. |
| 2006/0023184 | A1 | 2/2006 | Coon et al. |
| 2006/0033892 | A1 | 2/2006 | Cadee et al. |
| 2006/0033898 | A1 | 2/2006 | Cadee et al. |
| 2006/0033899 | A1 | 2/2006 | Hazelton et al. |
| 2006/0038968 | A1 | 2/2006 | Kemper et al. |
| 2006/0066826 | A1 | 3/2006 | Luijten et al. |
| 2006/0087630 | A1 | 4/2006 | Kemper et al. |
| 2006/0102849 | A1 | 5/2006 | Mertens et al. |
| 2006/0114445 | A1 | 6/2006 | Ebihara |
| 2006/0119809 | A1 | 6/2006 | Verhagen et al. |
| 2006/0158627 | A1 | 7/2006 | Kemper et al. |
| 2006/0221315 | A1 | 10/2006 | Beckers et al. |
| 2006/0232756 | A1 | 10/2006 | Lof et al. |
| 2006/0290909 | A1 | 12/2006 | Donders et al. |
| 2007/0030464 | A1 | 2/2007 | Kemper et al. |
| 2007/0085990 | A1 | 4/2007 | Chibana |
| 2007/0132974 | A1 | 6/2007 | Hazelton et al. |
| 2007/0139631 | A1 | 6/2007 | Novak et al. |
| 2007/0247603 | A1 | 10/2007 | Hazelton et al. |
| 2007/0268466 | A1 | 11/2007 | Leenders et al. |
| 2008/0002169 | A1 | 1/2008 | Hasegawa et al. |
| 2008/0094590 | A1 | 4/2008 | Coon |
| 2008/0192214 | A1 | 8/2008 | Leenders et al. |
| 2008/0212046 | A1 | 9/2008 | Riepen et al. |
| 2008/0218726 | A1 | 9/2008 | Lof et al. |
| 2009/0086175 | A1 | 4/2009 | Streefkerk et al. |
| 2009/0122283 | A1 | 5/2009 | Hasegawa |
| 2009/0147227 | A1 | 6/2009 | Steffens et al. |
| 2009/0174871 | A1 | 7/2009 | De Jong et al. |
| 2009/0201472 | A1 | 8/2009 | Kato |
| 2009/0237632 | A1 | 9/2009 | Direcks et al. |
| 2009/0279058 | A1 | 11/2009 | Hasegawa |
| 2009/0279060 | A1 | 11/2009 | Direcks et al. |
| 2009/0279062 | A1 | 11/2009 | Direcks et al. |
| 2010/0313974 | A1 | 12/2010 | Riepen et al. |
| 2011/0013159 | A1 | 1/2011 | Kramer et al. |
| 2011/0090472 | A1 | 4/2011 | Riepen et al. |
| 2011/0216292 | A1 | 9/2011 | Lafarre et al. |

FOREIGN PATENT DOCUMENTS

| | | |
|---|---|---|
| DE | 206 607 | 2/1984 |
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| EP | 1 420 300 | 5/2004 |
| EP | 1 477 856 A1 | 11/2004 |
| EP | 1 571 696 A1 | 9/2005 |
| EP | 1 571 697 | 9/2005 |
| EP | 1 628 329 A1 | 2/2006 |
| EP | 1 861 597 A | 7/2006 |
| FR | 2474708 | 7/1981 |
| JP | 57-153433 | 9/1982 |
| JP | 58-202448 | 11/1983 |
| JP | 59-19912 | 2/1984 |
| JP | 62-065326 | 3/1987 |
| JP | 62-121417 | 6/1987 |
| JP | 62-150828 | 7/1987 |
| JP | 63-49893 | 3/1988 |
| JP | 63-157419 | 6/1988 |
| JP | 04-305915 | 10/1992 |
| JP | 04-305917 | 10/1992 |
| JP | 05-62877 | 3/1993 |
| JP | 06-124873 | 5/1994 |
| JP | 6-168866 | 6/1994 |
| JP | 07-132262 | 5/1995 |
| JP | 7-220990 | 8/1995 |
| JP | 08-136475 | 5/1996 |
| JP | 08-171054 | 7/1996 |
| JP | 08-316125 | 11/1996 |
| JP | 08-330224 | 12/1996 |
| JP | 08-334695 | 12/1996 |
| JP | 10-003039 | 1/1998 |
| JP | 10-020195 | 1/1998 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2000-331931 | 11/2000 |
| JP | 2001-091849 | 4/2001 |
| JP | 2002-033267 | 1/2002 |
| JP | 2002-513856 | 5/2002 |
| JP | 2003-151948 | 5/2003 |
| JP | 2004-193252 | 7/2004 |
| JP | 2007-012954 | 1/2007 |
| JP | 2007-142366 | 6/2007 |
| JP | 2008-147652 | 6/2008 |
| JP | 2009-088508 | 4/2009 |
| JP | 2009-094145 | 4/2009 |
| JP | 2009-105469 | 5/2009 |
| JP | 2009-141359 | 6/2009 |
| JP | 2009-188383 | 8/2009 |
| KR | 10-0803266 | 2/2008 |
| KR | 1020080022201 | 3/2008 |
| TW | I232357 | 5/2005 |
| TW | 200921294 | 5/2009 |
| TW | 200951637 | 12/2009 |
| WO | 98/40791 | 9/1998 |
| WO | 99/49504 | 9/1999 |
| WO | 02/091078 | 11/2002 |
| WO | 02/097402 | 12/2002 |
| WO | 03/077036 | 9/2003 |
| WO | 03/077037 | 9/2003 |
| WO | 03/085708 | 10/2003 |
| WO | 2004/019128 | 3/2004 |
| WO | 2004/053596 | 6/2004 |
| WO | 2004/053950 | 6/2004 |
| WO | 2004/053951 | 6/2004 |
| WO | 2004/053952 | 6/2004 |
| WO | 2004/053953 | 6/2004 |
| WO | 2004/053954 | 6/2004 |
| WO | 2004/053955 | 6/2004 |
| WO | 2004/053956 | 6/2004 |
| WO | 2004/053957 | 6/2004 |
| WO | 2004/053958 | 6/2004 |
| WO | 2004/053959 | 6/2004 |
| WO | 2004/055803 | 7/2004 |
| WO | 2004/057589 | 7/2004 |
| WO | 2004/057590 | 7/2004 |
| WO | 2004/077154 | 9/2004 |
| WO | 2004/081666 | 9/2004 |
| WO | 2004/86470 | 10/2004 |
| WO | 2004/090577 | 10/2004 |
| WO | 2004/090633 | 10/2004 |
| WO | 2004/090634 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004/095135 | 11/2004 |
| WO | 2005/001432 | 1/2005 |
| WO | 2005/003864 | 1/2005 |
| WO | 2005/006026 | 1/2005 |
| WO | 2005/008339 | 1/2005 |
| WO | 2005/010611 | 2/2005 |

(56) References Cited

FOREIGN PATENT DOCUMENTS

| | | |
|---|---|---|
| WO | 2005/013008 | 2/2005 |
| WO | 2005/015283 | 2/2005 |
| WO | 2005/017625 | 2/2005 |
| WO | 2005/019935 | 3/2005 |
| WO | 2005/022266 | 3/2005 |
| WO | 2005/024325 | 3/2005 |
| WO | 2005/024517 | 3/2005 |
| WO | 2005/034174 | 4/2005 |
| WO | 2005/050324 | 6/2005 |
| WO | 2005/054953 | 6/2005 |
| WO | 2005/059617 | 6/2005 |
| WO | 2005/059618 | 6/2005 |
| WO | 2005/059645 | 6/2005 |
| WO | 2005/059654 | 6/2005 |
| WO | 2005/064955 | 6/2005 |
| WO | 2005/062128 | 7/2005 |
| WO | 2005/064400 | 7/2005 |
| WO | 2005/064405 | 7/2005 |
| WO | 2005/069055 | 7/2005 |
| WO | 2005/069078 | 7/2005 |
| WO | 2005/069081 | 7/2005 |
| WO | 2005/071491 | 8/2005 |
| WO | 2005/074606 | 8/2005 |
| WO | 2005/076084 | 8/2005 |
| WO | 2005/081030 | 9/2005 |
| WO | 2005/081067 | 9/2005 |
| WO | 2006/093340 | 9/2006 |
| WO | 2007/046523 | 4/2007 |

OTHER PUBLICATIONS

Korean Office Action dated Aug. 28, 2012 in corresponding Korean Patent Application No. 10-2011-0037783.
Singapore Written Opinion dated Aug. 17, 2012 in corresponding Singapore Patent Application No. 201102053-4.
Chinese Office Action dated Mar. 19, 2013 in corresponding Chinese Patent Application No. 201110096632.9.
Japanese Office Action dated Apr. 24, 2013 in corresponding Japanese Patent Application No. 2011-090841.
Taiwan Office Action dated Sep. 10, 2013 in corresponding Taiwan Patent Application No. 100109969.
European Office Action dated Mar. 12, 2014 in corresponding European Patent Application No. EP 11 156 770.7
M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defect", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.
G. Owen et al., "1/8 µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update of 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-24.
T. Matsuyama et al., "Nikon Projection Lens Update", SPIE Microlithography 2004, 12 pages (Mar. 2004).
"Depth-of-Focus Enhancement Using High Refractive Index Layer on the Imaging Layer", IBM Technical Disclosure Bulletin, vol. 27, Nl. 11, Apr. 1985, p. 6521.
A. Suzuki, "Lithography Advances on Multiple Fronts", EEdisign, EE Times, Jan. 5, 2004.
B. Line, The k3 coefficient in nonparaxial λ/NA scaling equations for resolution, depth of focus, and immersion lithography, J. Microlith., Microfab., Microsyst. 1(1):7-12.
M. Switkes et al., "Immersion Lithography: Optics for the 50 nm Node", 157 Anvers-1, Sep. 4, 2002.

\* cited by examiner

FLUID HANDLING STRUCTURE, LITHOGRAPHIC APPARATUS AND DEVICE MANUFACTURING METHOD

This application is a continuation of U.S. patent application Ser. No. 15/016,041, filed on Feb. 4, 2016, now allowed, which is a continuation of U.S. patent application Ser. No. 13/090,311, filed on Apr. 20, 2011, now U.S. Pat. No. 9,256,136, which claims priority and benefit under 35 U.S.C. § 119(e) to U.S. Provisional Patent Application Ser. No. 61/326,972, entitled "Fluid Handling Structure, Lithographic Apparatus and Device Manufacturing Method", filed on Apr. 22, 2010, and to U.S. Provisional Patent Application Ser. No. 61/362,961, entitled "Fluid Handling Structure, Lithographic Apparatus and Device Manufacturing Method", filed on Jul. 9, 2010. The contents of those applications are incorporated herein in their entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

In an immersion apparatus, immersion liquid is handled by a fluid handling system or apparatus, for example a fluid handling structure. A fluid handling system may supply immersion fluid and therefore be a fluid supply system. A fluid handling system may confine fluid and thereby be a fluid confinement system. A fluid handling system may provide a barrier to fluid and thereby be a barrier member. A fluid handling system may create or use a flow of fluid (such as gas), for example to help in handling liquid. Immersion liquid may be used as the immersion fluid. In that case, the fluid handling system may be a liquid handling system.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

Another arrangement is an all wet arrangement in which the immersion liquid is unconfined as disclosed in PCT patent application publication WO 2005/064405. In such a system, the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

SUMMARY

It is desirable to be able to move the substrate as fast as possible below the projection system. For this, the fluid handling system, especially for a localized area fluid handling system, should be designed to allow high scanning without significant liquid loss.

It is desirable, for example, to provide a fluid handling system which maintains liquid in a space between the final element of the projection system and the substrate.

According to an aspect, there is provided a fluid handling structure for a lithographic apparatus, the fluid handling structure successively having, at a boundary from a space configured to contain immersion fluid to a region external to the fluid handling structure:

an elongate opening or a plurality of openings arranged in a first line that, in use, is directed towards a substrate and/or a substrate table configured to support the substrate;

a gas knife device having an elongate aperture in a second line; and an elongate opening or a plurality of openings adjacent the gas knife device.

According to an aspect, there is provided a fluid handling structure for a lithographic apparatus, the fluid handling structure successively having, at a boundary of a space to which in use immersion liquid is confined to a region external to the fluid handling structure:

an elongate opening or a plurality of openings to extract fluid and arranged in a first line that, in use, is directed towards a facing surface of, for example, a substrate and/or a substrate table configured to support the substrate;

an elongate aperture for a gas knife, in a second line;

an elongate opening or a plurality of openings to extract liquid and adjacent the elongate aperture for the gas knife device.

According to an aspect, there is provided a lithographic apparatus comprising a fluid handling structure as above.

According to an aspect, there is provided a device manufacturing method, comprising:

providing an immersion liquid to a space between a final element of a projection system and a substrate and/or a substrate table configured to support the substrate;

retrieving immersion liquid from between the final element of the projection system and the substrate and/or substrate table through an elongate opening or a plurality of openings arranged in a first line;

forcing immersion liquid towards the elongate opening or plurality of openings in the first line by supplying gas through an aperture in a second line forming a gas knife;

extracting gas and remaining immersion liquid through an elongate opening or a plurality of openings adjacent the gas knife and on the opposite side of the gas knife to the elongate opening or plurality of openings in the first line.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
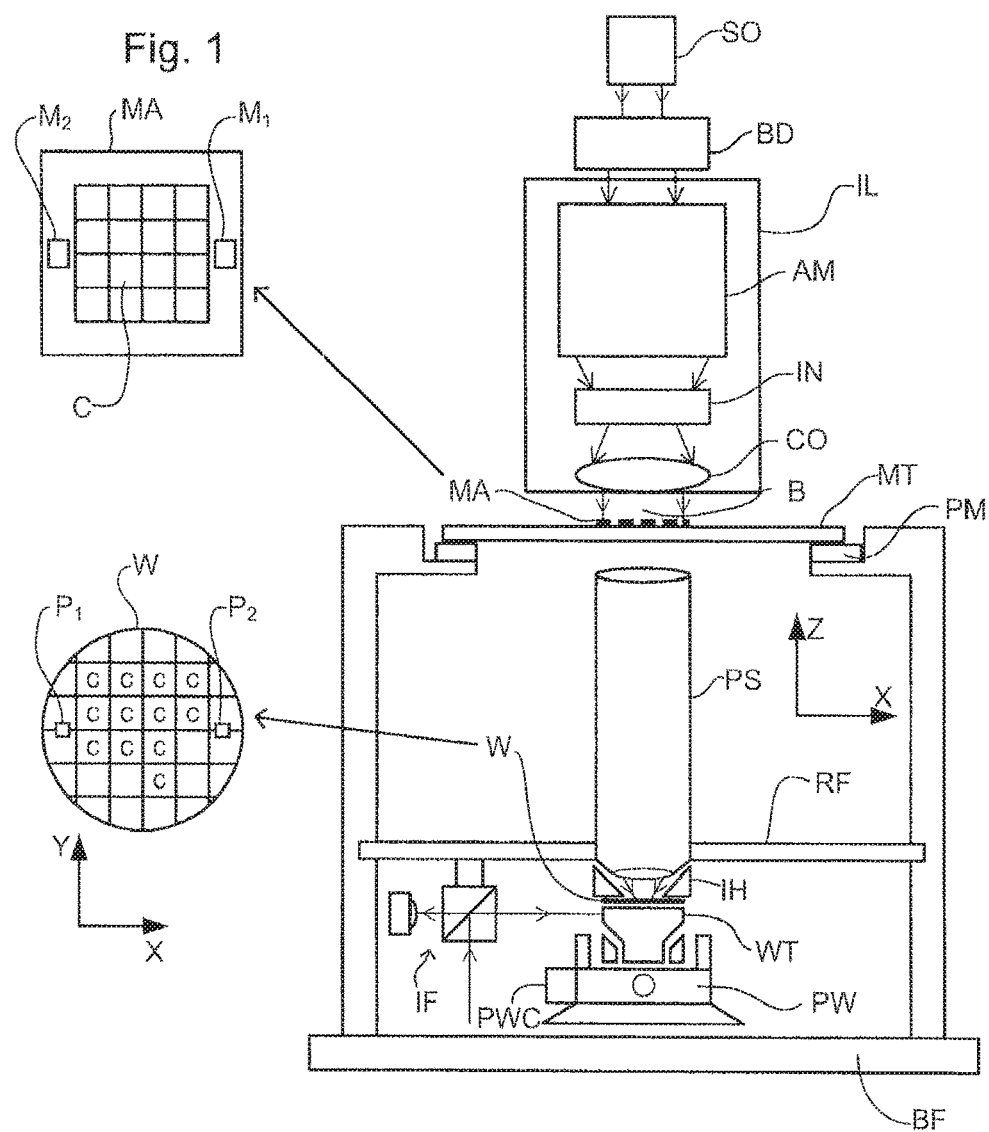
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form pad of the first positioner PM. Similarly, movement of the substrate table WT may be realized using a long-stroke module and a short-stroke module, which form part of the second positioner PW. In the case of a stepper (as opposed to a scanner) the support structure MT may be connected to a shod-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)

magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate. The volume or space filled with liquid remains substantially stationary relative to the projection system PS while the substrate W moves underneath that area. FIGS. 2-5 show different supply devices which can be used in such a system.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 (which are described below) may be used in such a system. However, sealing features might not be present, might not be activated, might not be as efficient as normal or might otherwise be ineffective to seal liquid to only the localized area.

Figure 2:
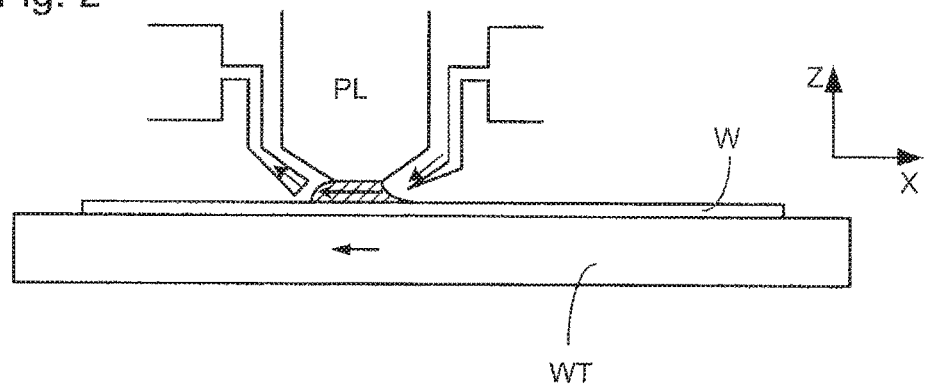
FIGS. 2 and 3 depict a liquid supply system for use in a lithographic projection apparatus.
Figure 3:
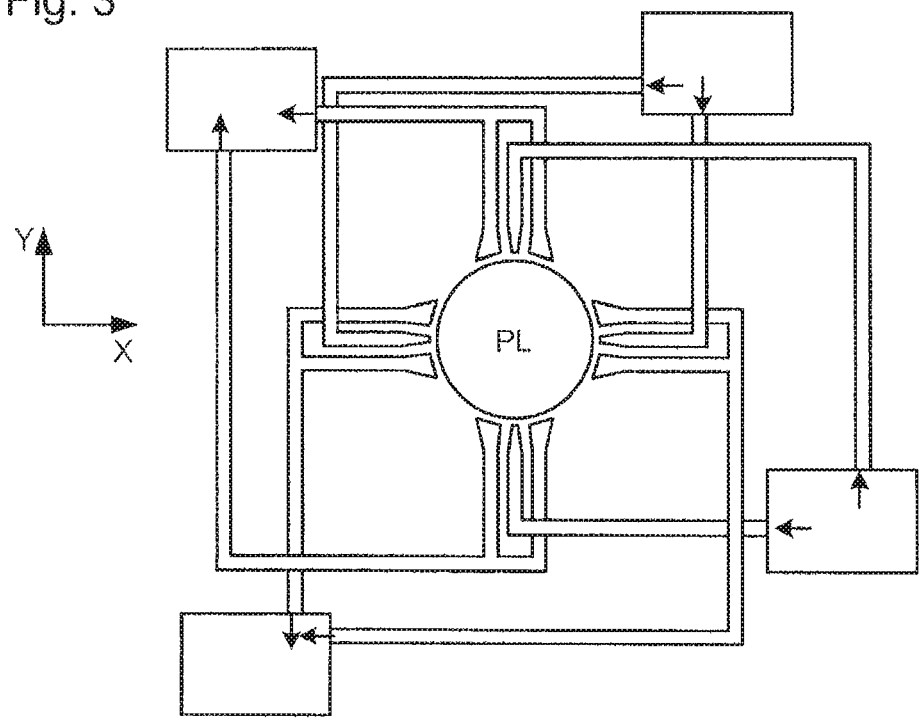

Four different types of localized liquid supply systems are illustrated in FIGS. 2-5. As illustrated in FIGS. 2 and 3, liquid is supplied by at least one inlet onto the substrate as indicated by an arrow, preferably along the direction of movement of the substrate relative to the final element. Liquid is removed by at least one outlet after having passed under the projection system as indicated by an arrow. As the substrate is scanned beneath the element in a −X direction, liquid is supplied at the +X side of the element and taken up at the −X side. FIG. 2 shows the arrangement schematically in which liquid flow is indicated by arrows; the liquid is supplied via inlet and is taken up on the other side of the element by outlet which is connected to a low pressure source. In the illustration of FIG. 2 the liquid is supplied along the direction of movement of the substrate relative to the final element, although this does not need to be the case. Various orientations and numbers of in- and out-lets positioned around the final element are possible; one example is illustrated in FIG. 3 in which four sets of an inlet with an outlet on either side are provided in a regular pattern around the final element, as indicated by arrows.

Figure 4:
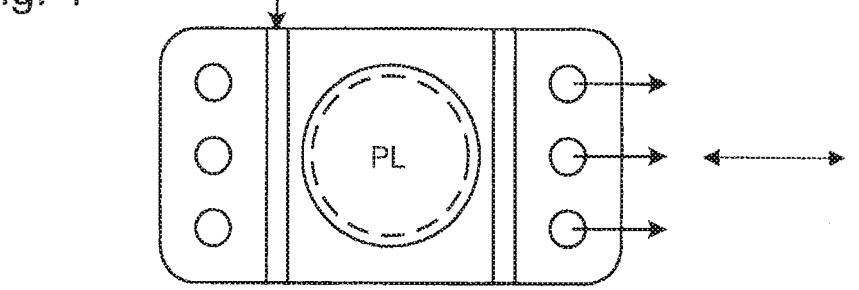
FIG. 4 depicts a further liquid supply system or use in a lithographic projection apparatus.
Figure 4:
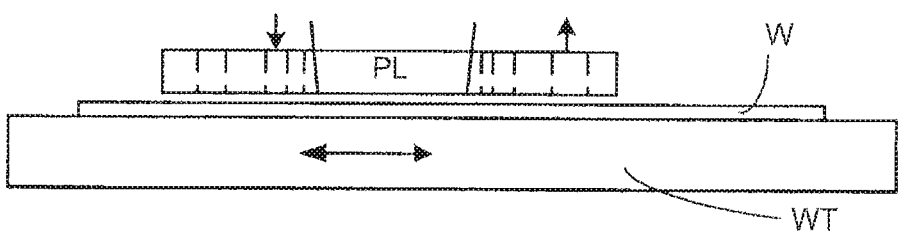

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Figure 5:
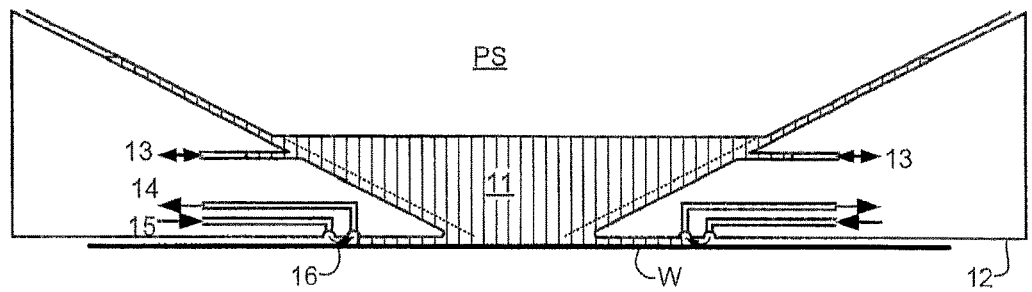
FIG. 5 depicts a further liquid supply system for use in a lithographic projection apparatus.

Another arrangement which has been proposed is to provide the liquid supply system with liquid confinement structure which extends along at least a part of a boundary of the space between the final element of the projection system and the substrate table. Such an arrangement is illustrated in FIG. 5. Arrows indicate the direction of flow.

FIG. 5 schematically depicts a localized liquid supply system or fluid handling structure with a liquid confinement structure 12, which extends along at least a part of a boundary of the space 11 between the final element of the projection system PS and a facing surface (e.g. the substrate table WT or substrate W). (Please note that reference in the following text to surface of the substrate W also refers in addition, or in the alternative, to a surface of the substrate table WT, unless expressly stated otherwise. Reference to movement of the substrate relative to another object, for example a projection system, includes reference to movement of the substrate table relative to the same object, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W. The seal may be a contactless seal such as a gas seal (such a system with a gas seal is disclosed in United States patent application publication no. US 2004-0207824) or fluid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round or any other suitable shape. At the bottom, the inner periphery closely conforms to the shape of the image field, e.g., rectangular, though this need not be the case.

The liquid may be contained in the space 11 by a gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

An embodiment of the invention relates to a particular type of extractor for use in a fluid handling structure which substantially prevents the meniscus from advancing beyond a certain point. That is, an embodiment of the invention relates to a meniscus pinning device which pins the edge of liquid, e.g. in the form of a liquid meniscus, in a space 11 between the final element of the projection system and the substrate and/or substrate table substantially in place. The meniscus pinning arrangement relies on the so-called gas drag extractor principle which has been described, for example, in U.S. patent application publication no. 2008/0212046, which is hereby incorporated by reference in its entirety. In that system the extraction holes may be placed in a cornered shape. The corners are aligned with a direction of relative motion between the projection system and the substrate and/or substrate table, for example the stepping and scanning directions. This helps reduce the force on the meniscus between two outlets for a given speed in the direction of relative motion compared to a case where the two outlets are aligned perpendicular to the direction of relative motion. However, an embodiment of the invention may be applied to a fluid handling structure which, in plan, may have any shape, or to a fluid handling structure that has a component part such as the extraction openings arranged in any shape. Such a shape in a non-limiting list may include an ellipse (such as a circle), a rectilinear shape (such as a rectangle, e.g. a square, or parallelogram, e.g., a rhombus) or a cornered shape with more than four corners (such as a four or more pointed star).

In a variation of the system of US 2008/0212046, to which an embodiment of the invention relates, the geometry of the cornered shape in which the openings are arranged allows sharp corners (selected from the range of about 60° to 90°, desirably the range of 75° to 90° and most desirably the range of 75° to 85°) to be present for the corners aligned both in the preferred directions of relative motion, for example, in the scanning and in the stepping directions. This may allow increased speed in the direction of each aligned corner. This is because the creation of liquid droplets due to an unstable meniscus in the scanning direction is reduced.

Where corners are aligned with both the scanning and stepping directions, increased speed may be achieved in those directions. Desirably the speed of movement in the scanning and stepping directions may be substantially equal.

Figure 6:
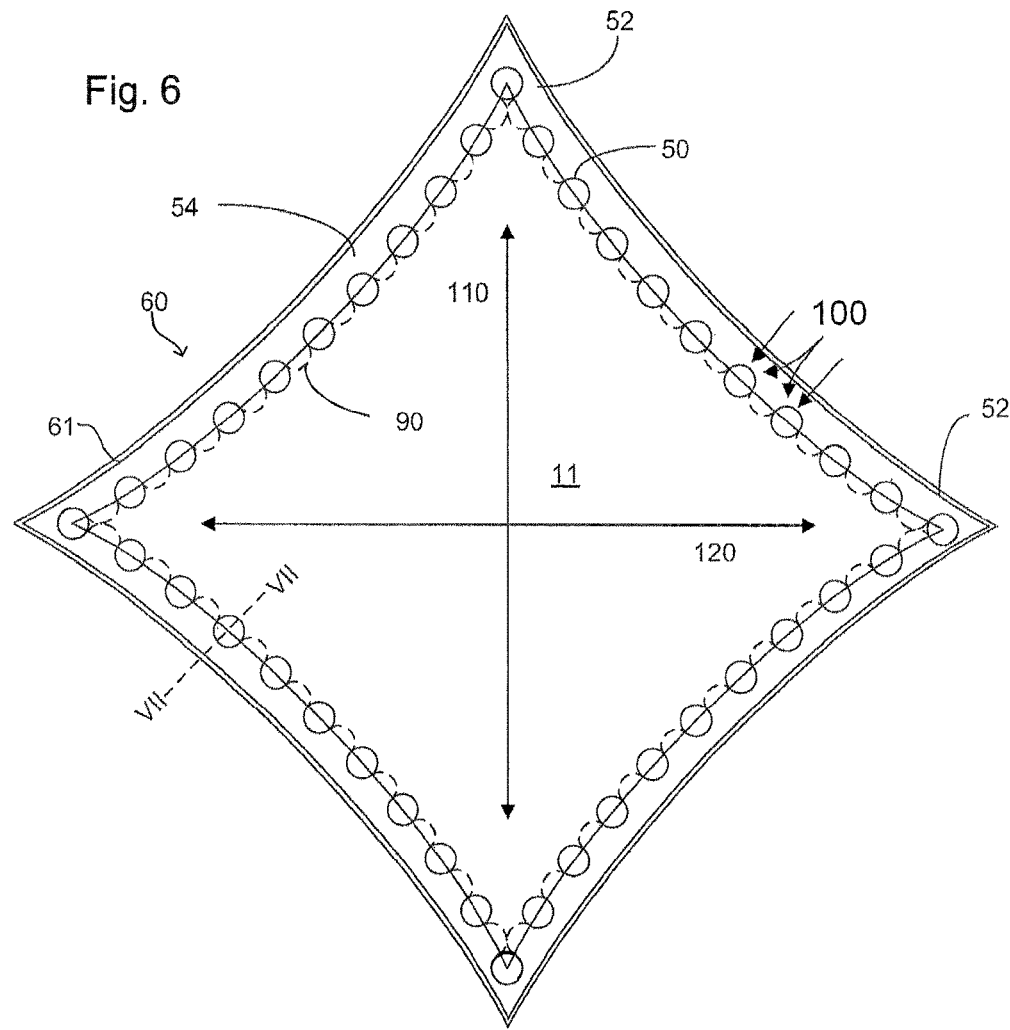
FIG. 6 is a schematic illustration, in plan, of a meniscus pinning system according to an embodiment of the present invention.

FIG. 6 illustrates schematically and in plan the meniscus pinning features of part of a fluid handling structure for use in an embodiment of the invention. The features of a meniscus pinning device are illustrated which may, for example, replace the meniscus pinning arrangement 14, 15, 16 of FIG. 5. The meniscus pinning device of FIG. 6 comprises a plurality of discrete openings 50 arranged in a first line or pinning line. Each of these openings 50 are illustrated as being circular though this is not necessarily the case. Indeed one or more of the openings 50 may be one or more selected from a circle, square, rectangular, oblong, triangular, an elongate slit, etc. Each opening has, in plan, a length dimension (i.e. in the direction from one opening to the adjacent opening) of greater than 0.2 mm, desirably greater than 0.5 mm or 1 mm, in an embodiment selected from the range of 0.1 mm to 10 mm, in an embodiment selected from the range of 0.25 mm to 2 mm. In an embodiment the length dimension is selected from the range of 0.2 mm to 0.5 mm, desirably the range of 0.2 mm to 0.3 mm. In an embodiment, the width of each opening is selected from the range of 0.1 mm to 2 mm. In an embodiment, the width of each opening is selected from the range of 0.2 mm to 1 mm. In an embodiment, the width of each opening is selected from the range of 0.35 mm to 0.75 mm, desirably approximately 0.5 mm.

Each of the openings 50 of the meniscus pinning device of FIG. 6 may be connected to a separate under pressure source. Alternatively or additionally, each or a plurality of the openings 50 may be connected to a common chamber or manifold (which may be annular) which is itself held at an under pressure. In this way a uniform under pressure at each or a plurality of the openings 50 may be achieved. The openings 50 can be connected to a vacuum source and/or the atmosphere surrounding the fluid handling structure or system (or confinement structure, barrier member or liquid supply system may be increased in pressure to generate the desired pressure difference.

In the embodiment of FIG. 6 the openings are fluid extraction openings. The openings 50 are inlets for the passage of gas and/or liquid into the fluid handling structure. That is, the openings may be considered as outlets from the space 11. This will be described in more detail below.

The openings 50 are formed in a surface of a fluid handling structure 12. That surface faces the substrate and/or substrate table in use. In one embodiment the openings are in a flat surface of the fluid handling structure. In another embodiment, a ridge may be present on the surface of the fluid handling structure facing the substrate. In an embodiment the openings may be in the ridge. In an embodiment, the openings 50 may be defined by needles or tubes. The bodies of some of the needles, e.g., adjacent needles, may be joined together. The needles may be joined together to form a single body. The single body may form the shape which may be cornered.

Figure 7:
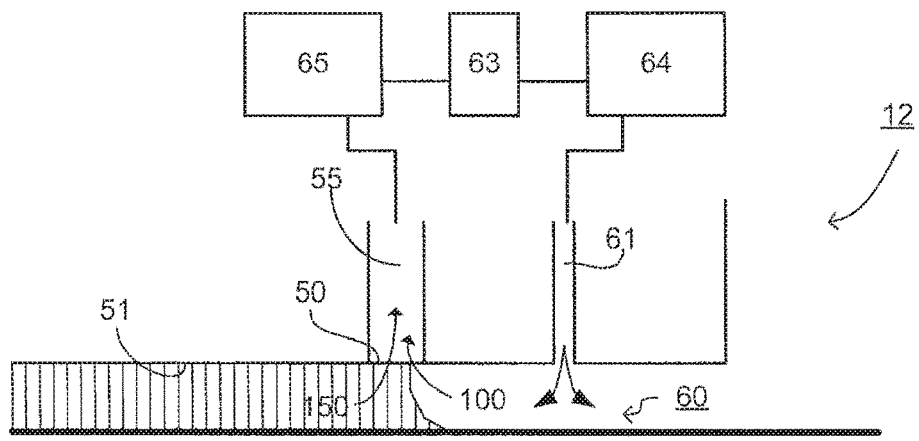
FIG. 7 depicts, in cross-section in part along line VII-VII in FIG. 6 and in a plane substantially perpendicular to a surface under a fluid handling structure, a meniscus pinning system for use in an embodiment of the present invention.

As can be seen from FIG. 7, the openings 50 are the end of a tube or elongate passageway 55, for example. Desirably the openings are positioned such that they face the substrate W in use. The rims (i.e. outlets out of a surface) of the openings 50 are substantially parallel to a top surface of the substrate W. The openings are directed, in use, towards substrate W and/or substrate table WT configured to support the substrate. Another way of thinking of this is that an elongate axis of the passageway 55 to which the opening 50 is connected is substantially perpendicularly (within +/−45°, desirably within 35°, 25° or even 15° from perpendicular) to the top surface of the substrate W.

Each opening 50 is designed to extract a mixture of liquid and gas. The liquid is extracted from the space 11 whereas the gas is extracted from the atmosphere on the other side of the openings 50 to the liquid. This creates a gas flow as illustrated by arrows 100 and this gas flow is effective to pin the meniscus 90 between the openings 50 substantially in place as illustrated in FIG. 6. The gas flow helps maintain the liquid confined by momentum blocking, by a gas flow induced pressure gradient and/or by drag (shear) of the gas flow on the liquid.

The openings 50 surround the space to which the fluid handling structure supplies liquid. That is, the openings 50 may be distributed around the surface of the fluid handling structure facing the substrate and/or substrate table. The openings may be substantially continuously spaced around the space (In an embodiment the spacing between some of the adjacent openings may be the same, although the spacing between adjacent openings 50 may vary). In an embodiment, liquid is extracted all the way around the shape which may be cornered. Liquid is extracted substantially at the point at which it impinges on the shape. This is achieved because the openings 50 are formed all the way around the space (in the shape). In this way the liquid may be confined to the space 11. The meniscus may be pinned by the openings 50, during operation.

As can be seen from FIG. 6, the openings 50 may be positioned so as to form, in plan, a cornered shape (i.e. a shape with corners 52). In the case of FIG. 6 the shape is a quadrilateral, such as a rhombus, e.g. a square, with curved edges or sides 54. The edges 54 may have a negative radius. An edge 54 may curve towards the center of the cornered shape, for example along a portion of the edge 54 located away from the corners 52. However, the average of the angle of all points on the edge 54 relative to a direction of relative motion may be referred to as a line of average angle which may be represented by a straight line without curvature.

Principal axes 110, 120 of the shape may be aligned with the major directions of travel of the substrate W under the projection system. This helps to ensure that the maximum scan speed is faster than if the openings 50 were arranged in a shape in which the direction of movement is unaligned with an axis of the shape, for example a circular shape. This is because the force on the meniscus between two openings 50 may be reduced if the principle axes are aligned with a direction of relative motion. For example, the reduction may be a factor cos θ. 'θ' is the angle of the line connecting the two openings 50 relative to the direction in which the substrate W is moving.

The use of a square shape allows movement in the step and scanning directions to be at a substantially equal maximum speed. This may be achieved by having each of the corners 52 of the shape aligned with the scanning and stepping directions 110, 120. If movement in one of the directions, for example the scan direction, is preferred to be faster than movement in the other direction, for example the step direction, then the shape may be a rhombus. In such an arrangement the primary axis of the rhombus may be aligned with the scan direction. For a rhombic shape, although each of the corners may be acute, the angle between the line of average angle of two adjacent sides (or edges) of the rhombus, for example relative to a direction of relative motion in the stepping direction, may be obtuse, i.e. more than 90° (for example selected from the range of about 90° to 120°, in an embodiment selected from the range of 90° to 105°, in an embodiment selected from the range of 85° to 105°).

Throughput can be optimized by making the primary axis of the shape of the openings 50 aligned with the major direction of travel of the substrate (usually the scan direction) and to have another axis aligned with the other major direction of travel of the substrate (usually the step direction). It will be appreciated that any arrangement in which θ is different to 90° will give an advantage in at least one direction of movement. Thus, exact alignment of the principal axes with the major directions of travel is not vital.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to have 90°. If it was desired that a corner would have an angle of less than 90°, it would be necessary to select corners aligned with a direction of relative motion to be less than 90°. The other corners would have an angle of greater than 90°.

The openings may be arranged in a star shape. In an embodiment of a star shape, the edges are straight instead of curved. The edges may meet at a point, e.g. an intermediate corner, which is radially inwardly of a straight line between two corners 52. This arrangement may not be as successful in pinning a meniscus at a high relative speed as an arrangement in which the edge between two adjacent corners 52 defined by the line joining the openings is smooth. Such a line defined by the openings 50 may define the cornered shape, is continuous and has a continuously changing direction. In the star shape embodiment, the intermediate corner along the side of the shape may pin the meniscus. The sharper a corner, the more the forces pinning the meniscus are focused on the corner. At a sharp corner, the pinning forces are focused on a short length of the edge of the shape. A corner with a smoother curve than a sharp corner, for example, a corner with a larger radius of curvature, has a longer length and so distributes the pinning forces along a longer curve of the corner i.e. around the corner. Thus, for a certain relative velocity between the substrate and the fluid handling structure, the effective meniscus pinning force applied to both corners is the same. However, for a defined length of the edge, the effective pinning force for the sharp corner is more than for the smoothly curved corner. The meniscus pinned at a sharp corner is more unstable at a lower relative velocity between the substrate and the fluid handling structure than a meniscus pinned by the smoothly curved corner.

FIG. 7 illustrates that the opening 50 is provided in a lower surface 51 of the fluid handling structure. This is however not necessarily the case and the opening 50 may be in a protrusion from the lower surface of the fluid handling structure. Arrow 100 shows the flow of gas from outside of the fluid handling structure into a passageway 55 associated with the opening 50. Arrow 150 illustrates the passage of liquid from the space into the opening 50. The passageway 55 and opening 50 are desirably designed so that two phase extraction (i.e. gas and liquid) desirably occurs in an annular flow mode. In annular gas flow gas may substantially flow through the center of the passageway 55 and liquid may substantially flow along the wall(s) of the passageway 55. A smooth flow with low generation of pulsations results.

There may be no meniscus pinning features radially inwardly of the openings 50. The meniscus is pinned between the openings 50 with drag forces induced by gas flow into the openings 50. A gas drag velocity of greater than about 15 m/s, desirably 20 m/s may be sufficient. The amount of evaporation of liquid from the substrate may be reduced thereby reducing both splashing of liquid as well as thermal expansion/contraction effects.

A plurality of discrete needles (which may each include an opening 50 and a passageway 55), for example at least thirty-six (36), each with a diameter of 1 mm and separated by 3.9 mm may be effective to pin a meniscus. In an embodiment, 112 openings 50 are present. The openings 50 may be square, with a length of a side of 0.5 mm, 0.3 mm, 0.2 mm or 0.1 mm.

Other geometries of the bottom of the fluid handling structure are possible. For example, any of the structures disclosed in U.S. patent application publication no. US 2004-0207824 could be used in an embodiment of the invention.

As can be seen in FIG. 6, an elongate aperture 61 (which may be slit shaped) is provided outside the openings 50. The elongate aperture 61 may be located further away from the space containing the immersion fluid than the openings 50 arranged in the first line. The aperture 61 may be substantially parallel to the first line in which the openings 50 are arranged. The elongate aperture may form a second line or knife line. The second line may surround the periphery of the shape formed by the openings 50. In an embodiment the elongate aperture is continuous and may completely surround the shape formed by the first line. In use, the aperture 61 is connected to an over pressure source. Gas flowing from the aperture 61 may form a gas knife 60 surrounding the meniscus pinning system formed by openings 50. The function of this gas knife will be described below. In an embodiment the elongate aperture comprises a plurality of discrete apertures (which may be elongate) along a side 54 of the shape. The plurality of apertures may be arranged in series.

In an arrangement, a liquid handling device may be as described hereinabove but lacks the gas knife 60. In such an arrangement, when the substrate table WT moves so that the meniscus of the immersion liquid crosses a lyophilic region, or a region of relatively low lyophobicity (i.e. having a lower contact angle to the immersion liquid than other parts of the substrate or substrate table surface), the immersion liquid may spread out into a film over the region of low lyophobicity. In the presence of water reference to lyophobicity is to hydrophobicity and lyophilic is to hydrophilic.

Formation of a film may depend on whether the speed of relative movement of the liquid meniscus and substrate or substrate table ("scan speed") is greater than a critical speed. With respect to a meniscus pinned by the openings 50, the critical speed is the relative velocity between the fluid handling structure 12 and the facing surface of a substrate and/or substrate table above which the meniscus may be no longer stable. The critical speed depends on the properties of the facing surface. The higher the contact angle of the facing surface the higher the critical speed in general. Once a film has begun to form, it may continue to grow even if the substrate has now moved so that the meniscus is over an area with a higher contact angle. For such an area with higher contact angle, the critical speed is higher. If the substrate moves at critical speed of the area with which the meniscus was previously in contact (i.e. a lower contact angle), the scan speed may be lower than the current critical scan speed.

The film may, in some cases after a short delay, break up into large droplets which are undesirable. In some cases, subsequent movements of the substrate table may cause the droplets to collide with the meniscus, which may generate bubbles in the immersion liquid. Regions having a relatively low lyophobicity (e.g. in the presence of water hydrophobicity) may include the edge of the substrate, a removable feature (e.g. an adherable planar member such as a sticker) on the substrate table, a positioning feature (e.g. an encoder grid or alignment mark) and/or a sensor (e.g. a dose sensor, an image sensor or a spot sensor). In an embodiment a region of relatively low lyophobicity (e.g. in the presence of water hydrophobicity) may be formed by degradation of a coating or surface treatment. The coating or surface treatment may be provided to increase the lyophobicity (e.g. in the presence of water hydrophobicity) of the surface on which it is provided.

In an embodiment, the gas knife 60 may function to reduce the thickness of any liquid film left on the substrate or substrate table. Reducing the thickness of the film may reduce the likelihood that it breaks into droplets. Additionally or alternatively the gas flow from the gas knife 60 may drive liquid towards the openings 50 and be extracted.

In an embodiment, the gas knife 60 operates to reduce the formation of a film. To achieve this, it is desirable that the distance between the center lines of the gas knife aperture 61 and the meniscus pinning opening 50 is selected from the range of from 1.5 mm to 4 mm, desirably from 2 mm to 3 mm. (In an embodiment, the gas knife aperture 61 has a plurality of apertures 61). The second line along which the aperture 61 is arranged generally follows the first line along which the openings 50 are formed so that the distance between adjacent ones of the aperture 61 and opening 50 is within the aforementioned ranges. The second line may be parallel to the line of the openings 50, although this not necessarily the case as described in U.S. Patent Application Publication No. US 2010-0313974, which is hereby incorporated by reference in its entirety.

It may desirable to maintain a constant separation between adjacent apertures 61 (where a plurality of apertures is present along the second line) and adjacent openings 50. In an embodiment this is desirable along the length of the center lines of the apertures 61 and openings 50. In an embodiment the constant separation may be in the region of one of more corners of the fluid handling device.

In arrangements such as those discussed above with reference to FIGS. 6 and 7, immersion liquid droplets may escape from the space in which the immersion liquid is confined during relative movement under the space of, for example, a height step in the surface facing the space. This may occur, for example, at a gap between an edge of a substrate and an edge of a recess in the table supporting the substrate, or at the surface of a sensor. Escape of liquid droplets may in particular occur when the relative speed between the fluid handling structure and the facing surface, e.g. scanning speed, is larger than a critical speed. Such a relative speed might be necessary when a higher scanning speed or throughput is desired. Such a critical speed may be dependent on at least one property of the facing surface.

In escaping from the immersion liquid in the space 11, the droplet breaks from a meniscus of the immersion liquid between the fluid handling structure and a facing surface (such as a substrate or a substrate table which supports the substrate). The meniscus may be pinned to the fluid handling structure by a fluid extraction opening which may extract liquid and gas in a two phase fluid flow, as discussed above.

The droplet may escape from a trailing side of the immersion space with respect to the movement of the facing surface.

In moving with the facing surface (with respect to the fluid handling structure) the droplet may then encounter a gas knife which directs the droplet back to the liquid extractor. However, sometimes the conditions may be such that the droplet is blocked from moving further away from the meniscus by the gas knife. Sometimes such a droplet may pass beyond the gas knife. In an embodiment the droplet escapes the influence of a component of the fluid handling structure. In another embodiment, the droplet encounters a further extractor and gas knife which may serve to extract and/or block the movement of the droplet away from the meniscus.

When the relative motion between the fluid handling structure and the facing surface in the plane of the facing surface, e.g. the scanning or stepping direction is subsequently changed, such a droplet can move relative to the fluid handling structure back towards the liquid meniscus. The droplet may at least partly be stopped by a gas knife it first passed when escaping from the meniscus. The droplet may be sufficiently large that it passes the gas knife towards the meniscus. The droplet may be extracted by extraction through the extraction opening provided at or at least near the edge or boundary of the immersion liquid confined in the space. However, if such a droplet is not extracted completely it may create a bubble on collision with the liquid meniscus of the liquid confined in the space.

The droplet may be insufficiently large and/or have insufficient relative speed to pass the gas knife towards the meniscus. The droplet may merge with one or more droplets which may be small to form a bigger droplet in front of the gas knife. In this case, the gas knife may be overloaded with immersion liquid, allowing the merged droplet to pass. Such a droplet will move relative to the fluid handling structure towards, and potentially collide with, the meniscus and may potentially create one or more bubbles.

Figure 8:
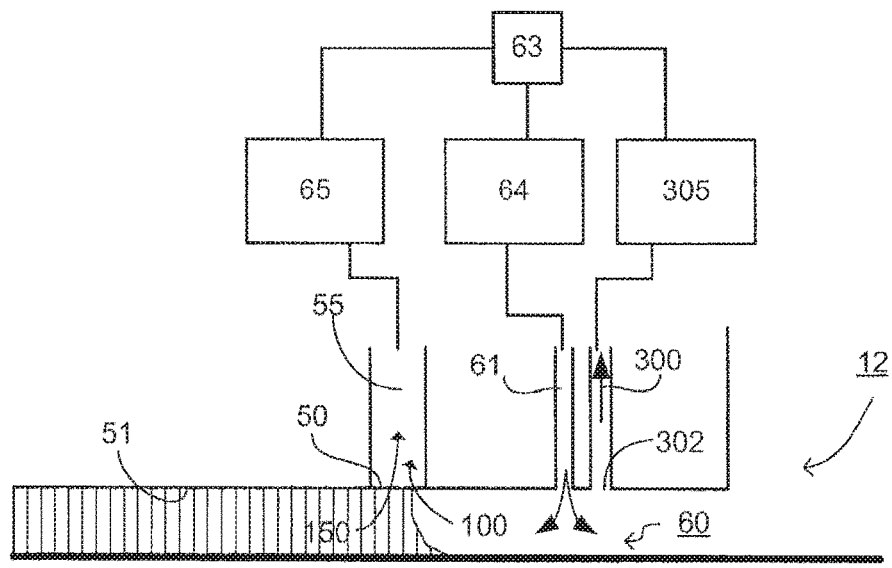
FIG. 8 depicts, in cross-section in a plane substantially perpendicular to a surface under a fluid handling structure, a part of a fluid handling structure according to an embodiment of the present invention.

In an embodiment, a significant reduction of the (amount and) size of the droplets passing a gas knife towards a meniscus during a change in the scanning direction may be achieved by adding an extra extraction 300 very close to the gas knife, as shown, for example, in FIG. 8, which is similar to FIG. 7 but with the addition of extraction 300. The extraction may be located adjacent the opening of the gas knife 61, away from the immersion space 11. It will be appreciated that variations of the arrangement depicted in FIG. 7 discussed herein may also be applied to the embodiment depicted in FIG. 8.

The extra extraction may prevent saturation (or breaching) of the gas knife. Therefore, the gas knife may retain its effectiveness in blocking a droplet from reaching the meniscus (i.e. its desired droplet stopping power). For example, the extra extraction may remove the immersion liquid that the gas knife collects (or "bulldozers") when a change in the scanning direction is made. The amount of immersion liquid being extracted may be very little but sufficient to prevent overloading the gas knife. In this situation the gas knife may have to "bulldozer" the immersion liquid, or push the collected immersion liquid. This may require the gas knife flow to be larger than the flow through the extraction at the edge of the space containing the immersion liquid. The provision of the extra extraction 300 may prevent this situation, such that the gas knife flow does not have to be as large, as compared, for example, to an arrangement without the extra extraction.

The extra extraction 300 may be provided by an elongate opening or a plurality of openings 302 adjacent a gas knife device that is used in conjunction with the extraction at the edge of the space containing the immersion liquid. For example, the one or more openings 302 of the extra extraction may be adjacent the elongate aperture 61 of the gas knife 60. The separation between the two lines of openings used for the extraction and the line of the gas knife device may be substantially the same at all locations around the space containing the immersion liquid.

Figure 9:
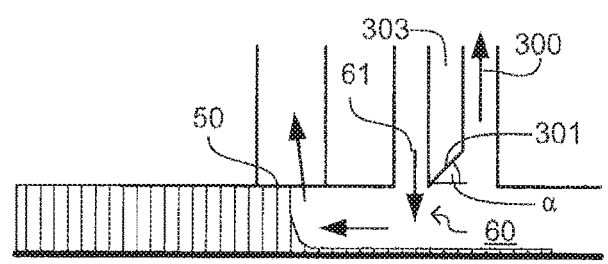
FIG. 9 depicts, in cross-section in a plane substantially perpendicular to a surface under a fluid handling structure, a part of a fluid handling structure according to a further embodiment of the present invention.

As shown in FIG. 9, the edge 301 of the opening 302 for the extra extraction 300 adjacent the gas knife device that is closest to the gas knife device 60 may be provided at an oblique angle α relative to the surface 51 of the fluid handling structure 12 that is between the first and second lines and beyond the opening adjacent the gas knife device. In this arrangement, the width of the opening adjacent the gas knife decreases with distance from the surface.

In an embodiment, the angle α of the edge 301 of the opening 302 relative to the surface 51 of the fluid handling structure 12 is selected from the range of from 10° to 60°, or from 10° to 45°, or is desirably 20°. The provision of an angled edge 301 of the opening 302 for the extra extraction 300 may be beneficial because it enables the edge of the opening 302 to be as close as possible to the edge of the aperture 61 of the gas knife device 60. However, at the same time, it may be ensured that the thickness of the wall 303 separating the aperture 61 from the channel providing the extra extraction 300 is not so thin that additional manufacturing challenges are created.

The separation of the nearest edges of the elongate aperture 61 of the gas knife device 60 and the elongate opening or plurality of openings 301 for the additional extraction 300, namely adjacent the gas knife device 60, may be selected from the range of from 0.25 mm to 0.75 mm, desirably 0.5 mm. In general, the one or more openings of the additional extraction 300 may be as close as possible to the aperture 61 of the gas knife device 60. This may minimize the size of liquid droplets that may be formed by the merger of smaller droplets adjacent the gas knife. In turn, this may reduce the size of droplets that may pass through the gas knife 60, reducing the likelihood of bubbles forming in the immersion liquid when the droplets collide with the meniscus. However, as noted above, the desire to minimize the separation must be balanced with the difficulties that may be introduced in the process of manufacturing the fluid handling structure 12 if the wall 303 separating the openings of the extra extraction 300 from the aperture 61 of the gas knife device 60 becomes too small.

The width of the opening 302 of the extra extraction 300 may, for example, be selected from the range of from 30 μm to 200 μm, or from 100 μm to 150 μm.

In embodiments as depicted in FIGS. 7 and 8, a controller 63 is provided to control the rate of flow of gas through the aperture 61 in the second line to form the gas knife 60. In an embodiment, the controller 63 may also control the rate of flow of gas through the openings 50 in the first line. The controller 63 may control an over pressure source 64 (e.g. a pump) and/or an under pressure source 65 (e.g. a pump, possibly the same pump that provides the overpressure). The controller 63 may be connected to one or more suitable flow control valves in order to achieve the desired flow rates. The controller may be connected to one or more two phase flow rate meters associated with one or more openings 50 to measure the extracted flow rate, a flow rate meter associated with the aperture 61 to measure the supplied gas flow rate, or both. A suitable arrangement for a two phase flow meter is described in U.S. Patent Application Publication No. US 2011-0013159, which is hereby incorporated by reference in its entirety.

In an embodiment, as depicted in FIG. 8, the one or more openings 302 of the extra extraction 300 may be connected to an under pressure source 305 (e.g. a pump, possibly the same as provides one or both of the over pressure source 64 and the under pressure source 65). As shown in FIG. 8, the under pressure source 305 for the additional extraction 300 may be controlled by the same controller 63 as is used to control the overpressure source 64 and/or the under pressure source 65. Likewise the controller 63 may be connected to one or more suitable flow control valves and/or flow rate meters as above in order to achieve desired flow rates. It will also be appreciated that separate controllers may be provided for one or more of the under pressure and over pressure sources 64,65,305.

In an embodiment, the controller 63 is configured such that the flow rates of the gas knife 60 from the elongate aperture 61 and the extraction through the one or more openings 50 and the one or more openings 302 of the extra extraction 300 are such that the flow of gas from the gas knife device 60 is substantially perpendicular to the surface of the fluid handling structure between the first and second line. This may be achieved, for example, by balancing the extraction rate through the one or more openings 50 in the first line and the one or more openings 302 of the extra extraction 300 and balancing the total extraction with the gas flow of the gas knife device 60.

Controlling the gas flow rates such that the flow of gas from the gas knife device 60 is perpendicular, or relatively perpendicular, to the surface of the fluid handling structure, and therefore the opposing surface of the substrate table WT and/or substrate W may improve the performance of the gas knife device for a given gas flow rate of the gas knife device. This in turn may increase the scan rate that may be used.

In an arrangement, the gas flow rate out of the aperture 61 in the second line to form the first gas knife device 60 may be less than are equal to 100 liters per minute, for example 75 liters per minute or less. The gas flow rate extracted through the one or more openings 50 in the first line may be less than or equal to 75 liters per minute, for example 50 liters per minute. The gas flow rate of the additional extraction 300 may be, for example, higher because it will only be extracting small quantities of liquid. For example, the gas flow rate of the additional extraction 300 may be approximately 75 liters per minute.

The gas knife is desirably close enough to the openings 50 to create a pressure gradient across the space between them. There is desirably no stagnant zone in which a layer of liquid (i.e. a liquid film), or a liquid droplet can accumulate, for example beneath the fluid handling structure 12. In an embodiment, the flow rate of gas through the openings 50 may be coupled to the gas flow rate through the elongate aperture 61 as described in U.S. Patent Application Publication No. US 2010-0313974 and U.S. Patent Application Publication No. US 2007-0030464, which are each hereby incorporated by reference in its entirety. The gas rate may therefore be directed substantially inwardly from the aperture 61 to the openings 50. Where the gas flow rate through the openings 50 and the aperture 61 is the same, the flow rate may be referred to as 'balanced'. A balanced gas flow may be desirable when scanning in one direction as it minimizes the thickness of a liquid residue, e.g. film.

In an embodiment, the gas flow rate through the openings 50 in the first line and the aperture 61 in the second line may be balanced on one side of the fluid handling structure 12 when scanning in a first direction, in which the surface opposite the fluid handling structure is traveling away from the meniscus. When traveling in the opposite direction, the gas flow rate of the gas knife 60 may be balanced with the sum of the extraction gas flow rate through the openings 50 in the first line and the extra extraction 300.

As described elsewhere herein, the openings 50 may be arranged to form any closed shape which may include in a non-limiting list, e.g. a quadrilateral such as a parallelogram, a rhombus, a rectangle, a square, or ellipse such as a circle. In each case the aperture 61 for the gas knife 60 may have a substantially similar shape as the shape formed by the openings 50. In an embodiment of the invention, an elongate opening may be provided in the first line in place of the plurality of openings 50 for use in extracting liquid from the space into the fluid handling structure. The separation between the edge of the shape formed by the one or more openings 50 and the shape formed by the aperture 61 is within the aforementioned ranges. In an embodiment the separation is desirably constant.

In general, it will be appreciated that in an embodiment, the arrangement of the fluid handling structure 12 may be configured in order to ensure that the performance of the extra extraction 300 is as high as possible or maximized, namely it is effective at extracting liquid adjacent the gas knife 60. As discussed above, this may be achieved by ensuring that the extraction fluid flow through the extra extraction 300 is sufficiently high. Alternatively or additionally, this may be achieved by ensuring that the additional extraction 300 is as close as possible to the edge of the aperture 61 of the gas knife device 60. Alternatively or additionally, this may be achieved by ensuring that the gas flow through the gas knife device 60 is sufficiently high that there is a radial flow of gas outwards, namely in the direction of the extra extraction 300. Alternatively or additionally, this may be achieved by operating the fluid handling structure 12 at a fly height that is as low as possible, taking into account other limitations of the operation of the fluid handling structure and the lithographic apparatus, namely ensuring that the lower surface 51 of the fluid handling structure 12 is as close as possible to the surface of the substrate W and/or substrate table WT.

Figure 10:
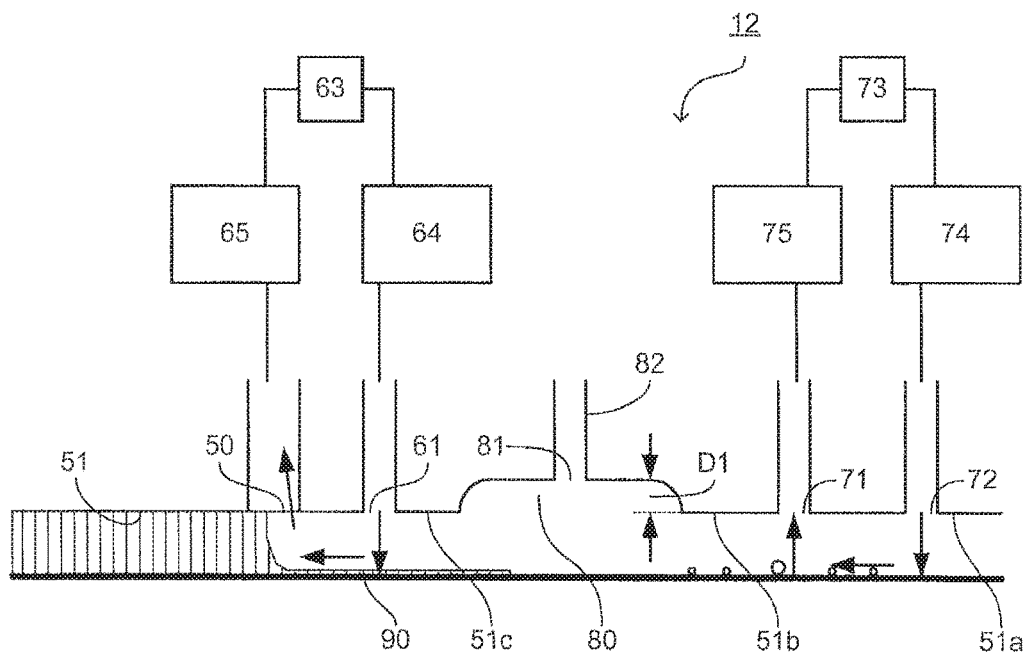
FIG. 10 depicts, in cross-section in a plane substantially perpendicular to a surface under a fluid handling structure, a part of a fluid handling structure.

FIG. 10 schematically depicts in cross-section a part of a fluid handling structure that is a development of the arrangement depicted in FIG. 7. At the boundary between the space 11 in which the liquid is contained and a region that is external to the fluid handling structure, for example in the ambient atmosphere external to the fluid handling structure, one or more openings 50 and the aperture 61 may be arranged in the manner discussed above. One or more openings 50 may be arranged in a first line for use in extracting liquid from the space into the fluid handling structure. The aperture 61 may be provided in a second line and arranged to form a gas knife device. The gas from the gas knife may force liquid towards the openings 50 in the first line.

One or more openings 71 may be provided in a third line, or droplet line, further away from the immersion liquid than the first and second lines. A second gas knife device is formed by an aperture 72 arranged in a fourth line, or droplet knife line. (In an arrangement, the aperture 72 has a plurality of apertures 72). The fourth line is arranged to be further from the space 11 containing the immersion liquid than the third line. The gas flow through the second gas knife device may be mainly directed inwardly so that most of it passes through the openings 71. In an arrangement the gas flow through the one or more openings 71 and the aperture 72 of the second gas knife device is balanced.

The fluid handling structure of this arrangement includes a first gas knife device operating in conjunction with a first plurality of openings 50. This combination performs the primary extraction of immersion liquid.

The fluid handling structure has a second gas knife device operating with the third line of openings 71. The provision of an additional combination of one or more openings and associated gas knife has been found to be unexpectedly beneficial.

An arrangement such as that depicted in FIG. 7, with a single gas knife device and a single associated line of openings, may leave a residue of liquid on the surface of the substrate W and/or substrate table WT. The liquid residue may be in the form of a liquid film or a plurality of droplets. After a while, the film may break up into a plurality of droplets. The droplets may grow into larger droplets and may become unacceptably large. The liquid residue may be left, as explained herein, when the scan speed exceeds the critical scan speed for a portion of the facing surface. This may, for example, occur when the scan speed increases for a surface with a continuous contact angle beyond the critical scan speed for the surface. The liquid residue may be left in the location of a portion of a surface where the contact angle changes so the critical scan speed for that portion decreases so the scan speed exceeds the critical scan speed, even if the scan speed is constant. Such a portion may be an edge of a feature, such as the edge of the substrate, a shutter member, a sensor or a sensor target, for example at the moment when the liquid meniscus crosses the edge.

In arrangements in which the gas knife device is decoupled from the line of openings 50, 71 by a connection to atmospheric pressure, for example by a space that is connected to atmosphere and is located between the gas knife device and the openings 50, 71, further problems may occur. Liquid may accumulate between the gas knife device and the openings, creating large droplets. When the direction of movement from the substrate W and/or substrate table WT relative to the projection system PS and the fluid handling structure changes, such large droplets may collide with the advancing meniscus of the immersion liquid. The collision of a droplet with the meniscus may cause an inclusion of gas, creating a bubble which may be small or larger. Furthermore, a disturbance of the meniscus caused by the collision may also form a bubble. Formation of a bubble is undesirable. An arrangement as described herein may help reduce one or more of the above or other problems.

The provision in the fluid handling structure of two gas knife devices and associated openings for extraction permits the design and/or setting of process control parameters of each combination to be selected for the specific purpose of each combination, which may be different. The gas flow rate out of the aperture 61 in the second line, forming the first gas knife, may be less than the gas flow rate out of the aperture 72 in the fourth line forming the second gas knife device.

In an arrangement it may be desirable for the gas flow rate for the first gas knife device to be relatively low because, as explained above, the flow through the plurality of openings 50 in the first line is in two phase, with a significant amount of liquid. If the flow rate through the aperture 61 in the second line and the plurality of openings 50 in the first line is an unstable two phase flow regime, for example the flow rate may be too high, the two phase flow may result in force variations, e.g. vibrations, which is undesirable. On the other hand, the more stable the flow regime, for example the lower the flow rate, through the aperture 61 in the second line and/or the plurality of openings 50 in the first line, the greater the leakage of immersion liquid past the gas knife device at a given speed of movement of the substrate W and/or substrate table WT relative to the projection system PS and the fluid handling structure. Therefore, the gas flow rate in a single gas knife arrangement was essentially a compromise between these two conflicting demands.

The provision in the fluid handling structure of the second gas knife device and associated extraction beneficially enables a lower flow rate to be used for the first gas knife device. The second gas knife device may be used to remove droplets of liquid that pass beyond the first gas knife device. Furthermore, the gas flow rate through the aperture 72 in the fourth line and the one or more openings 71 in the third line may be relatively high. This is because the flow is largely gas. Beneficially, this increased flow rate improves the performance of removal of liquid droplets from the surface of the substrate W and/or the substrate WT.

In an arrangement, the gas flow rate out of the aperture 61 in the second line to form the first gas knife device may be less than or equal to 100 liters per minute, desirably less than or equal to 75 liters per minute, desirably approximately 50 liters per minute or less. In a particular arrangement, the gas flow rate out of the aperture 72 in the fourth line to form the second gas knife device may be greater than or equal to 60 liters per minute desirably greater than or equal to 100 liters per minute, desirably approximately 125 liters per minute or more.

Figure 11:
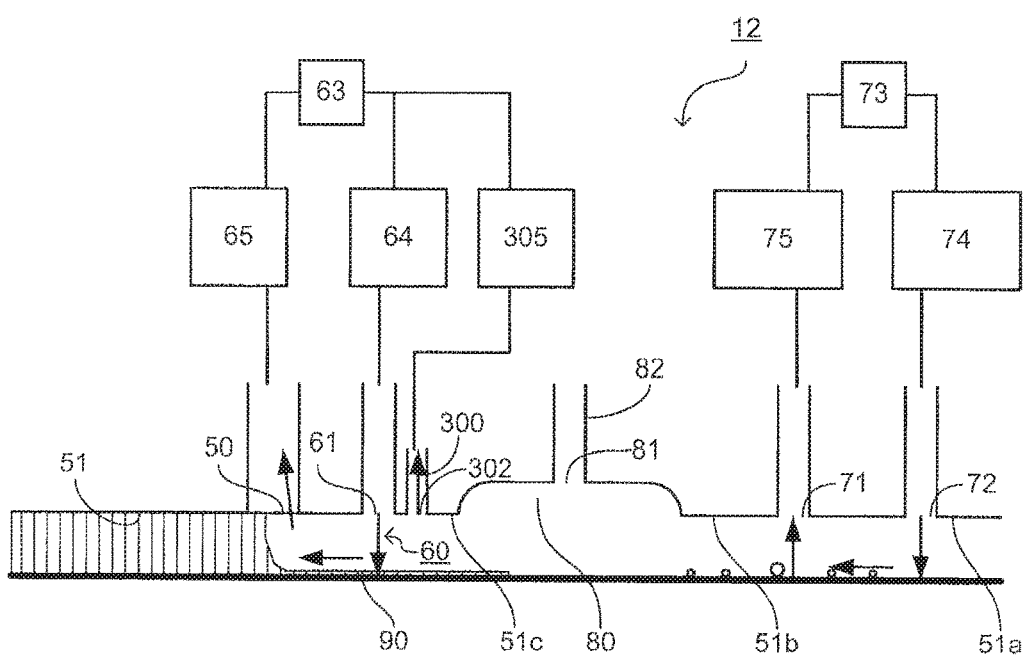
FIG. 11 depicts, in cross-section in a plane substantially perpendicular to a surface under a fluid handling structure, a part of a fluid handling structure according to a further embodiment of the present invention.

Although an arrangement such as that depicted in FIG. 10 may beneficially reduce the liquid that may accumulate between the one or more openings 50 in the first line and the one or more openings 71 in the third line, it may not eliminate the accumulation of such liquid. Accordingly, a fluid handling structure as schematically depicted in FIG. 11 may be provided in an embodiment of the invention. As depicted, the arrangement corresponds to that depicted in FIG. 10 but includes additional extraction 300 adjacent to the elongate aperture 61 of the first gas knife device 60. As with the arrangement depicted in FIG. 8, the additional extraction 300 may prevent large droplets of liquid from accumulating adjacent the first gas knife device 60, in particular when the direction of scanning of the substrate table WT and/or substrate W relative to the fluid handling structure is reversed. Variations of the arrangements discussed above in relation to FIGS. 8 and 10 apply to the arrangements including the additional extraction 300 as depicted in FIG. 11.

A controller 73 (which may be the same as the controller 63 discussed above) is provided to control the rate of flow of gas through the aperture 72. The controller 73 also controls the rate of flow of gas through the one or more openings 71. The controller 73 may control an overpressure source 74 (e.g. a pump) and/or an underpressure source 75 (e.g. a pump, possibly the same pump as provides the overpressure). There may be one or more suitable control valves connected to and controlled by the controller 73 in order to provide the desired flow rates. The controller may control the valves based on flow measurements supplied by one or more two phase flow meters arranged to measure the flow through the one or more openings 71, one or more flow meters arranged to measure the flow through the aperture 72, or both. Such an arrangement may be similar to the arrangement for the flow components associated with the first and second lines.

One or both of the controllers 63, 73 may be configured to control the gas flow through the openings 50, 302, 71 in proportion to the gas flow rate of the associated gas knife. In an embodiment, the gas flow rate through the gas knife is up to 20% or up to 10% different from the total flow rate through the associated openings 50,302,71. In an embodiment the gas flow rate through openings 50,302,71 may be controlled to match the gas flow through the associated one or more apertures 61,72. In an embodiment, the gas flow rate through the elongate aperture 72 of the second gas knife may match, for example, be substantially the same as, the gas flow rate through the opening 71. Similarly, the gas flow rate through the elongate aperture 61 of the first gas knife 60 may match the gas flow rate through one or both sets of the openings 50,302 on either side on the first gas knife 60, as discussed above in relation to the discussion of the arrangement depicted in FIG. 8.

It will be appreciated that the arrangement of the embodiments of the invention depicted in FIGS. 8, 9 and 11, may include several variations.

In an embodiment, the controllers 63,73 may control the activation of either or both gas knives such that it is active when it is, or may be, required. In other words, the gas knife may be switched off under appropriate predetermined conditions. For example, the gas knife may be switched off when the scan speed is safely below a critical speed and is switched on when the scan speed goes above, or is likely to go above, the critical speed for the surface currently under the meniscus or approaching the meniscus. For example, when a central portion of the substrate moves under the fluid handling structure 12, one or both of the gas knives may be switched off. The contact angle is constant over this portion of the substrate and the critical scan speed for the portion may be sufficiently high that it is not exceeded. Before, during and/or after the meniscus of the space moves over an edge, for example of the substrate, sensor, shutter member or sensor target, one or both of the gas knife devices may be operational.

The third and fourth lines, along which the one or more openings 71 and the aperture 72 may be arranged, may generally follow the first and second lines along which the one or more openings 50 and the aperture 61 are formed. In an embodiment the shape formed by the one or more openings 71 is different from the shape formed by the one or more openings 50. It may be desirable for the third and fourth lines, e.g. in an embodiment the first to fourth lines, to be parallel such that there is a constant separation between the lines.

In an embodiment, the aperture 72 in the fourth line, used to form the second gas knife device where desired may have the same features as described with reference to the aperture 61 in the second line. As with the aperture 61 of the first gas knife device, the aperture 72 may be formed as a single slit or as a plurality of elongate apertures.

The one or more openings 71 in the third line where required may be formed as a single elongate slit or as a plurality of elongate openings.

In an embodiment, the lower surface 51 of the fluid handling structure may be arranged such that an outer portion 51a of the lower surface extends away from the aperture 72 in the fourth line.

In the embodiment depicted in FIGS. 10 and 11, a recess 80 having a depth of D1 is provided in the lower surface 51 of the fluid handling structure. The recess 80 may be provided in a fifth line, or a recess line, between the second and third lines. In an embodiment, the recess 80 is arranged such that it is parallel to any of the first to fourth lines, desirably at least the second line, the third line or both.

The recess 80 may include one or more openings 81 connected by a gas conduit 82 to atmosphere, such as the ambient atmosphere, for example to a region external to the fluid handling structure. The recess 80, desirably when connected to an external atmosphere, may function to decouple the first gas knife device and associated one or more openings 50 in the first line from the second gas knife device and associated one or more openings 71 in the third line. The recess 80 decouples the operation of the components located either side; so the features radially inward of the recess are decoupled from the features radially outward.

On either side of the recess 80, there may be respective portions 51b,51c of the lower surface 51 of the fluid handling structure. The respective portions 51b, 51c may respectively separate the edge of the recess 80 from the edge of the one or more openings 71 in the third line and the aperture 61 in the second line. (Note that these edges of aperture 61 and one or more openings 71 are not the second and third lines, because the lines pass through the center of the cross-sections of the openings; the edges are therefore away from the line.) The portions 51b,51c of the lower surface 51 of the fluid handling structure on either side of the recess 80 may, in conjunction with the surface of the substrate W and/or the substrate table WT, function as respective dampers. Such a damper may assist in ensuring that the gas flows from the first and second gas knives flow towards the respective openings 50,71. In an embodiment one or both of the surfaces 51b, 51c may function as a damper.

In order to help reduce the likelihood of liquid collecting within the recess 80, the recess may be provided with a shape without a sharp edge. The surface may be smoothly rounded. A sharp edge is undesirable because liquid may easily collect. For example, the shape of the recess 80 may be configured such that the minimum radius of curvature at any point around the surface of the recess is at least 0.1 mm, desirably greater than 0.2 mm.

In an embodiment, a fluid handling structure may include one or more openings in the lower surface 51 of the fluid handling structure that is connected by a gas conduit to atmosphere, such as the ambient atmosphere, for example to a region external to the fluid handling structure. For example, such openings connected to atmosphere may be provided to an embodiment that does not incorporate a recess such as that described above. Such an arrangement may be used to decouple the first gas knife and associated one or more openings 50 in the first line from the second gas knife device and associated one or more openings 71 in the third line.

As discussed above, liquid collecting on the lower surface 51 of the fluid handling structure, in particular between the aperture 61 in the second line and the one or more openings 71 in the third line, may be undesirable. The collected liquid may cause problems when the direction of relative movement of the substrate W and substrate table WT with respect to the projection system and the fluid handling structure changes. In an embodiment, a lithographic apparatus that includes a fluid handling structure described herein may include a controller PWC that is arranged to control the actuator system of a positioner PW configured to move the substrate table WT and a substrate W held thereon.

The controller PWC may be configured such that if the speed of the substrate table WT relative to the projection system PS is above a particular velocity, steps are taken to reduce the problems that may be caused by the collected liquid as discussed above. The speed may be selected to correspond to a critical velocity of the first gas knife device for example with respect to a portion of the facing surface, or slightly below this critical velocity. The critical velocity may be considered as a velocity of the substrate table WT relative to the projection system PS at which immersion liquid leakage through the gas knife, for example radially outwards, exceeds a given amount. It will be appreciated that such a critical velocity may be dependent on the configuration of the gas knife device, the gas flow rate of the gas knife device and/or the nature of the surface of the substrate and/or substrate table WT at that point.

The speed of the substrate table WT relative to the projection system PS may be above the given speed. It may be required to change the direction of movement of the substrate table relative to the projection system. In an embodiment, the controller PWC is configured such that if the speed is above the given speed and it is required to change direction of the movement of the substrate table, the controller PWC first reduces the speed of the substrate table relative to the projection system PS below the given speed. The controller PWC may then initiate the change of direction. Accordingly, the change of direction no longer occurs above, for example, the critical velocity of the first gas knife device, minimizing or reducing the problems caused by immersion liquid that may have collected between the first and second gas knife devices.

Figure 12:
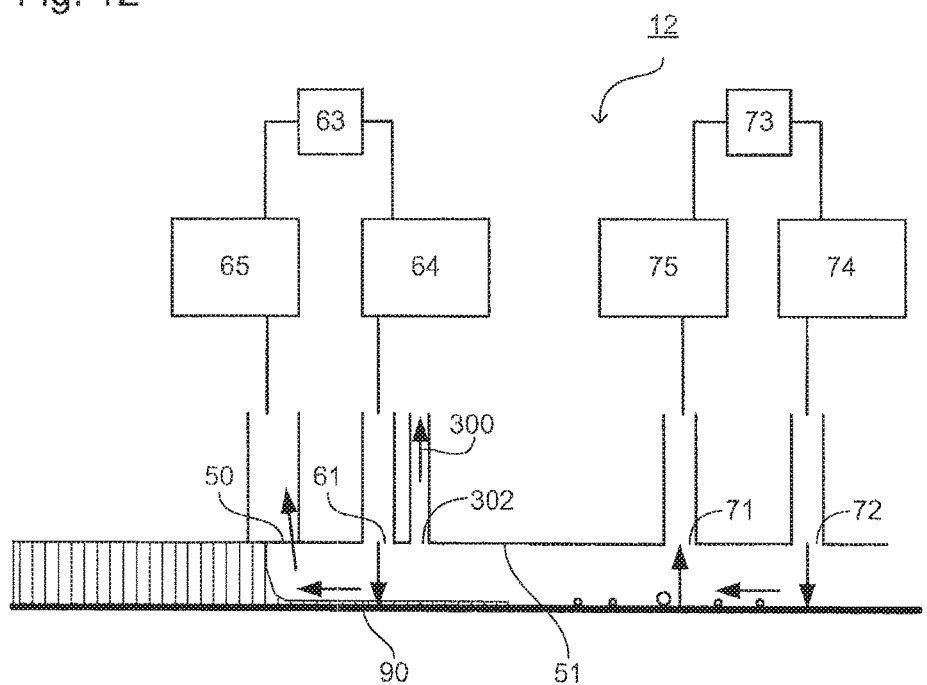
FIG. 12 depicts, in cross-section in a plane substantially perpendicular to a surface under a fluid handling structure, a part of a fluid handling structure according to a further embodiment of the present invention.

FIG. 12 depicts a fluid handling structure according to an embodiment of the invention. As shown, the fluid handling structure of this embodiment is similar to the fluid handling structure depicted in FIG. 11. However, in this embodiment no recess connected to atmosphere is provided. Instead, the lower surface 51 of the fluid handling structure is continuous between the aperture 61 forming the first gas knife device and the one or more openings 71 in the third line. In other words, in this region, there is no opening or aperture in the lower surface 51 of the fluid handling structure 12.

In this embodiment, the gas flow through the aperture 61 in the second line may be balanced with the gas flow through the one or more openings 50 in the first line and the gas flow through the additional extraction 300. The gas flow through the aperture 72 in the fourth line may be balanced with the gas flow through the one or more openings 71 in the third line. It is therefore not necessary to decouple these arrangements radially inward and radially outward of the lower surface 51. Beneficially, therefore, the recess 80 of FIG. 11 is not required, reducing the likelihood of liquid collecting in the space between the aperture 61 in the second line and the one or more openings 71 in the third line or reducing the amount of liquid that is collected in this region. In this case, the separation between the aperture 61 in the second line and the one or more openings 71 in the third line may be selected from the range of from 1 mm to 4 mm, for example 2 mm.

Figure 13:
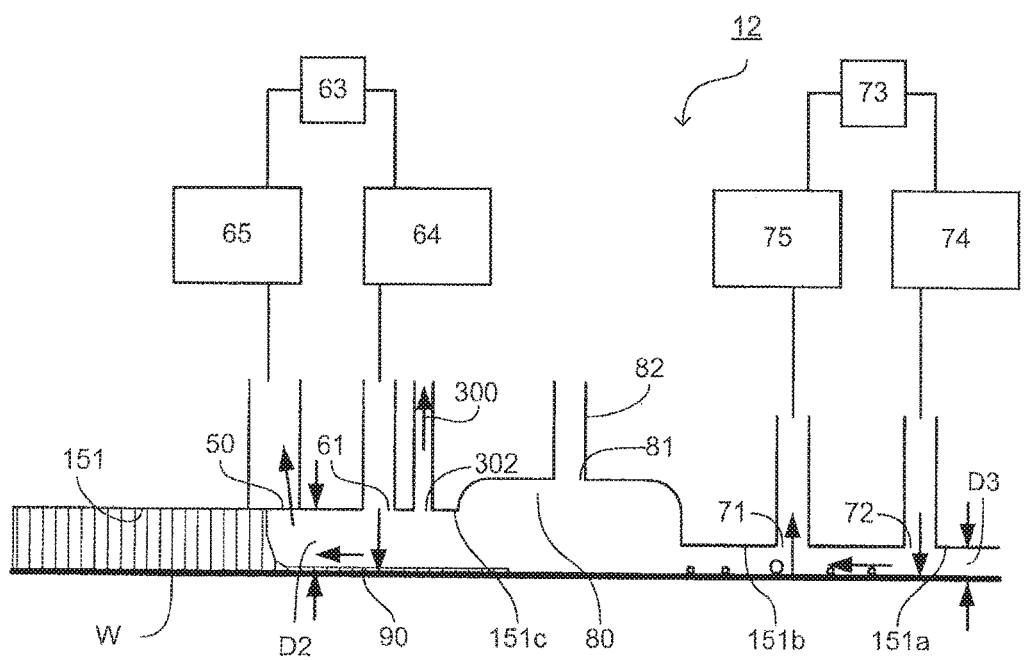
FIG. 13 depicts, in cross-section in a plane substantially perpendicular to a surface under a fluid handling structure, a part of a fluid handling structure according to a further embodiment of the present invention.

FIG. 13 depicts a fluid handling structure according to an embodiment of the invention. As shown, the fluid handling structure of this embodiment is similar to the fluid handling structure depicted in FIG. 11. For brevity, the differences between the embodiments will be discussed and it will be appreciated that the variants discussed above in relation to the embodiment depicted in FIG. 11 may also apply to the embodiment depicted in FIG. 13.

As shown in FIG. 13, the lower surface 151 of the fluid handling structure 12 may be arranged such that, in use, the separation between the different parts 151a,151b,151c of the lower surface 151 and the upper surface of the substrate W and/or substrate table WT are not the same. In an embodiment as depicted, there is a separation D2 between a portion 151c of the lower surface 151 in the region of the openings 50 in the first line, the aperture 61 of the gas knife device 60 in the second line and the openings 302 of the extra extraction and the substrate W and/or substrate table WT.

There may bee separation D3 between portions 151a,151b of the lower surface adjacent to the one or more openings 71 in the third line and the aperture 72 in the fourth line and the substrate W and/or substrate table WT.

The separation D2 may be greater than the separation D3. This is in contrast to the embodiment depicted in FIG. 11, in which the lower surface 51 of the fluid handling structure is generally planar. The lower surface may be planar except for the provision of the openings 50,302,71 and apertures 61,72 in the first to fourth lines and the recess 80. Accordingly, for the embodiment of FIG. 11, the separation of each part of the lower surface 51 around the openings 50,302,71 and apertures 61,72 in the first to fourth lines from the upper surface of the substrate W and/or substrate table WT is substantially the same. In another embodiment the separation D3 may be greater than the separation D2.

An arrangement such as that depicted in FIG. 13, namely one with different distances between a facing surface and the lower surface 151, may be beneficial because various factors affect the optimum separation between the lower surface 151 of the fluid handling structure 12 and the upper surface of the substrate W and/or substrate table WT. For example, it may be desirable for the separation between the lower surface 151 of the fluid handling structure around the one or more openings 50 in the first line and the upper surface of the substrate W and/or substrate table WT to be as large as possible. This may reduce or minimize the probability of bubbles forming when a droplet collides with the meniscus. This situation may occur, for example, during a change in the scanning direction of the substrate W and/or substrate table WT.

However, it may be desirable to minimize the separation between the lower surface 151 of the fluid handling structure 12 around the aperture 72 in the fourth line that is used to form the second gas knife. For example, the smaller the separation, the lower the flow rate that may be required and/or the wider the aperture 72 may be in order to provide effective drying.

Therefore, the lower surface 151 of the fluid handling structure 12 may be arranged such that the separation of the lower surface 151 around the first line from the upper surface of the substrate W and/or substrate table WT is different from the separation of the lower surface 151 around the fourth line from the upper surface of the substrate W and/or substrate table WT. It is therefore possible to improve the performance of both parts of the fluid handling structure rather than selecting a single or substantially constant separation between all parts of the lower surface 151 and the upper surface of the substrate W and/or the substrate table WT. The need to compromise between the two conflicting requirements may be avoided.

In an embodiment the separation between the lower surface 51;151;251 of the fluid handling structure 12 of any of the embodiments of the present invention and the upper surface of the substrate W and/or the substrate table WT may be selected from the range of 50 µm to 250 µm.

In an embodiment such as that depicted in FIG. 13, the separation D2 between the lower surface 151 around the one or more openings 50 in the first line and the upper surface of the substrate W and/or substrate table WT may be selected from the range of 130 µm to 250 µm, or the range of 180 µm to 250 µm, desirably approximately 230 µm. In an embodiment such as that depicted in FIG. 13, the separation D3 between the lower surface 151 adjacent to the aperture 72 in the fourth line used to form the second gas knife and the upper surface of the substrate W and/or substrate table WT may be selected from the range of 50 µm to 180 µm, desirably approximately 130 µm.

It will be appreciated, however, that the optimum separations between the different parts of the lower surface 151 of the fluid handling structure and the upper surface of the substrate W and/or substrate table WT may be dependent upon the nature of the upper surface of the substrate W and/or substrate table WT. For example, a relevant factor may be, in a non-limiting list: the receding contact angle with the liquid, the scan speed of the substrate W and/or substrate table WT and the flow rate of at least one of the gas knife devices.

As noted herein, it may be desirable to optimize, for example, maximize the separation D2 between the lower surface 151 around the one or more openings 50 in the first line and the upper surface of the substrate W and/or substrate table WT. However it should further be appreciated that there may be a maximum practical separation. Beyond the optimum, for example maximum, practical separation that may be used, the leakage of liquid may become excessive.

As depicted in FIG. 13, the separation of the lower surface 151 of the fluid handling structure 12 around the aperture 61 in the second line (used to form the first gas knife 60) and the openings 302 of the extra extraction 300 from the upper surface of the substrate W and/or substrate table WT may be the same as the separation of the lower surface 151 around the one or more openings 50 in the first line from the upper surface of the substrate W and/or the substrate table WT. However, it should be appreciated that this need not be the case.

As depicted in FIG. 13, the separation between the lower surface 151 of the fluid handling structure 12 adjacent to the aperture 72 in the fourth line (used to form the second gas knife) may be the same as the separation between the lower surface 151 of the fluid handling structure 12 adjacent to the one or more openings 71 in the third line and the upper surface of the substrate W and/or substrate table WT. Such an arrangement may therefore allow the separation between the lower surface 151 of the fluid handling structure 12 adjacent to the one or more openings 71 in the third line and the upper surface of the substrate W and/or substrate table WT to be reduced, for example minimized. This may assist in ensuring that the extraction is as effective as possible. However, this need not be the case.

Figure 14:
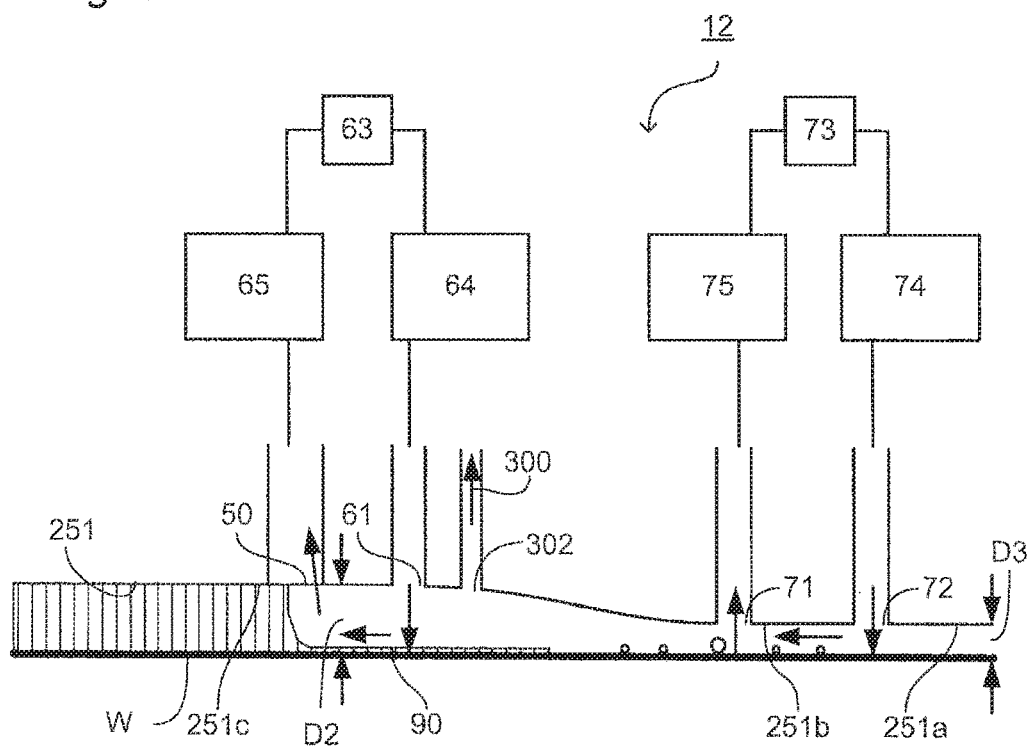
FIG. 14 depicts, in cross-section in a plane substantially perpendicular to a surface under a fluid handling structure, a part of a fluid handling structure according to a further embodiment of the present invention.

FIG. 14 depicts a fluid handling structure 12 according to an embodiment of the invention. As shown, the fluid handling structure 12 is similar to the fluid handling structure 12 depicted in FIG. 12. The fluid handling structure of the present embodiment does not include a recess 80. However, there is a similar difference between the fluid handling structure of this embodiment and the embodiment shown in FIG. 12 to the difference between the fluid handling structures depicted in FIGS. 13 and 10.

The different portions 251a, 251b, 251c of the lower surface 251 of the fluid handling structure 12 may be arranged such that at least one portion has a different separation from the upper surface of the substrate W and/or the substrate table WT, in use. The separation D2 between the lower surface 251 of the fluid handling structure 12 adjacent the one or more openings 50 and the upper surface of the facing surface may be greater than the separation D3 between the lower surface 251 of the fluid handling structure 12 adjacent to the aperture 72 and the upper surface of the facing surface. Each variation described herein, for example in relation to the embodiments depicted in FIGS. 12 and 13 apply to the embodiment depicted in FIG. 14.

In the embodiment depicted in FIG. 14, the lower surface 251 of the fluid handling structure 12 may be arranged such that the difference in separation between the upper surface of the substrate W and/or substrate table WT and the lower surface 251 changes in the area between the aperture 61 and the one or more openings 71. The separation between the lower surface 251 and the facing surface may vary between the second and third lines. The separation may change, e.g. decrease, from the second line to the third line. However, in general the change in separation may be provided in any or all of the areas between the one or more openings 51 and the aperture 72. The separation between the lower surface 251 and the facing surface may change, e.g. decrease, between the first and fourth lines.

It should be appreciated that, as described above, the lower surface 251 of the fluid handling structure 12 may be arranged such that there are no sharp corners at which liquid may be accumulated. The lower surface may be substantially continuous between the first and second lines, the second and third lines, the third and fourth lines and any combination of the surfaces between adjacent lines. The lower surface 251 of the fluid handling structure may be arranged such that the minimum radius of curvature at any point on the surface is at least 0.1 mm, desirably greater than 0.2 mm.

Although reference has been made to the use of one or more openings 50,302,71 which operate as two phase extractors, in an embodiment based on any of the variations described herein, the one or more openings in either the first or fourth lines or the extra extraction 300 may be replaced by a porous member or microsieve, like that described in U.S. Patent Application Publication No. US 2006-0038968, which is hereby incorporated by reference in its entirety. Each porous member may operate to extract liquid in single phase, or dual phase, fluid flow. In an embodiment, the gas flow may be directed radially inwardly but instead of if being extracted through the porous member, the gas flow may be extracted by a gas extraction opening located between the gas supply aperture and the porous member. In such an embodiment the gas flow helps to reduce the residue liquid left on the facing surface by the gas knife device. An embodiment of the invention may therefore be implemented in such an arrangement, achieving similar benefits as achieved by the embodiments described above. As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

Embodiments of the invention are hereinafter described by means of the following clauses:

Clause 1 A fluid handling structure for a lithographic apparatus, the fluid handling structure successively having, at a boundary from a space configured to contain immersion fluid to a region external to the fluid handling structure: an elongate opening or a plurality of openings arranged in a first line that, in use, is directed towards a substrate and/or a substrate table configured to support the substrate; a gas knife device having an elongate aperture in a second line; and an elongate opening or a plurality of openings adjacent the gas knife device.

Clause 2 The fluid handling structure according to Clause 1, wherein the first and second lines surround the space configured to contain the immersion fluid; the elongate opening or plurality of openings adjacent the gas knife device are provided along the length of the gas knife device; and respective separations between the first line, second line and the elongate opening or plurality of openings adjacent the gas knife device are substantially the same at all locations around the space configured to contain the immersion fluid.

Clause 3 The fluid handling structure according to Clause 1 or Clause 2, wherein a separation of the nearest edges of the elongate opening or plurality of openings adjacent the gas knife device and of the elongate aperture of the gas knife device is selected from the range of from 0.25 mm to 0.75 mm, desirably 0.5 mm.

Clause 4 The fluid handling structure according to any of Clauses 1 to 3, wherein the opening adjacent to the gas knife device is an elongate opening.

Clause 5 The fluid handling structure according to Clause 4, wherein the width of the opening adjacent the gas knife device is selected from the range of from 30 μm to 200 μm, or from 100 μm to 150 μm.

Clause 6 The fluid handling structure according to Clause 4 or Clause 5, wherein the edge of the opening adjacent the gas knife device that is closest to the gas knife device is provided at an oblique angle relative to the surface of the fluid handling structure that is between the first and second lines and beyond the opening adjacent the gas knife device such that the width of the opening adjacent the gas knife decreases with distance from the surface.

Clause 7 The fluid handling structure according to Clause 6, wherein the angle of the edge of the opening adjacent the gas knife device relative to the surface of the fluid handling structure is selected from the range of from 10° to 60°, or from 10° to 45°, or is desirably 20°.

Clause 8 The fluid handling structure according to any of Clauses 1 to 7, wherein the opening adjacent the gas knife device is covered by a porous material.

Clause 9 The fluid handling structure according to any of Clauses 1 to 8, wherein the elongate opening or plurality of openings in the first line and the elongate opening or plurality of openings adjacent the gas knife device are inlets for the passage of a gas and/or liquid into the fluid handling structure.

Clause 10 The fluid handling structure according to any of Clauses 1 to 9, wherein the elongate opening or plurality of openings in the first line are connected, in use, to an under pressure source and the elongate opening or plurality of openings adjacent the gas knife device are connected, in use, to an under pressure source.

Clause 11 The fluid handling structure according to Clause 10, further comprising a controller connected or connectable to the under pressure source connected to the elongate opening or plurality of openings in the first line and/or to the under pressure source connected to the elongate opening or plurality of openings adjacent the gas knife, the controller configured to control the at least one under pressure source such that the gas flow rate through the elongate opening or plurality of openings in the first line and/or the elongate opening or plurality of openings adjacent the gas knife device is such that, in use, the flow of gas from the gas knife device having an elongate aperture in the second line is substantially perpendicular to the surface of the fluid handling structure between the first and second lines.

Clause 12 The fluid handling structure according to any of Clauses 1 to 11, wherein, beyond the elongate opening or plurality of openings adjacent the gas knife device having an elongate aperture in the second line, the fluid handling structure further successively has at the boundary: an elongate opening or a plurality of openings in a third line; and a second gas knife device having an elongate aperture in a fourth line.

Clause 13 The fluid handling structure according to Clause 12, wherein the first to fourth lines successively surround the space configured to contain the immersion fluid; and separation between the respective lines are substantially the same at all locations around the space configured to contain the immersion fluid.

Clause 14 The fluid handling structure according to Clause 12 or Clause 13, wherein the elongate opening or plurality of openings in the third line are inlets for the passage of a gas and/or liquid into the fluid handling structure.

Clause 15 The fluid handling structure according to any one of Clauses 12 to 14, wherein the elongate opening or plurality of openings in the third line is connected, in use, to an under pressure source, and the fluid handling structure further comprises a controller connected or connectable to the under pressure source, the controller configured to control the under pressure source such that the gas flow rate through the elongate opening or plurality of openings in the third line is greater than or equal to the gas flow rate out of the aperture in the fourth line to form the gas knife.

Clause 16 The fluid handling structure according to any one of Clauses 12 to 15, wherein the apertures in the second and fourth lines are connected, in use, to a gas supply, and the fluid handling structure further comprises a controller connected or connectable to the gas supply, the controller configured to control the gas supply such that the gas flow rate out of the aperture in the fourth line to form the gas knife is greater than the gas flow out of the aperture in the second line to form the gas knife.

Clause 17 A fluid handling structure according to any one of Clauses 12 to 16, further comprising a lower surface that, in use, is generally parallel to an upper surface of a substrate and/or a substrate table configured to support the substrate, and the openings and apertures in the first to fourth lines are formed in the lower surface.

Clause 18 A fluid handling structure according to Clause 17, wherein in use, the separations of the area of the lower surface around the openings and apertures in the first to fourth lines from the upper surface of the substrate and/or substrate table are substantially the same.

Clause 19 A fluid handling structure according to Clause 17, wherein in use, the separation of the area of the lower surface around the elongate opening or plurality of openings in the first line from the upper surface of the substrate and/or substrate table is greater than the separation of the area of the lower surface around the aperture in the fourth line from the upper surface of the substrate and/or substrate table.

Clause 20 A fluid handling structure according to any one of Clauses 17 to 19, wherein the fluid handling structure comprises a recess in the lower surface, arranged in a fifth line between the second and third lines.

Clause 21 A fluid handling structure according to Clause 20, wherein the recess comprises at least one opening that is connected by a gas conduit to the region external to the fluid handling structure.

Clause 22 A fluid handling structure for a lithographic apparatus, the fluid handling structure successively having, at a boundary of a space to which in use immersion liquid is confined to a region external to the fluid handling structure: an elongate opening or a plurality of openings to extract fluid and arranged in a first line that, in use, is directed towards a facing surface of, for example, a substrate and/or a substrate table configured to support the substrate; an elongate aperture for a gas knife, in a second line; an elongate opening or a plurality of openings to extract liquid and formed adjacent the elongate aperture for the gas knife.

Clause 23 The fluid handling structure of Clause 22, wherein the elongate opening or the plurality of openings in the first line is to pin a meniscus of the immersion liquid in the space.

Clause 24 A lithographic apparatus, comprising a fluid handling structure according to any one of the preceding Clauses.

Clause 25 A device manufacturing method, comprising: providing an immersion liquid to a space between a final element of a projection system and a substrate and/or a substrate table configured to support the substrate; retrieving immersion liquid from between the final element of the projection system and the substrate and/or substrate table through an elongate opening or a plurality of openings arranged in a first line; forcing immersion liquid towards the elongate opening or plurality of openings in the first line by supplying gas through an aperture in a second line forming a gas knife; extracting gas and remaining immersion liquid through an elongate opening or a plurality of openings adjacent the gas knife and on the opposite side of the gas knife to the elongate opening or plurality of openings in the first line.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid. In an embodiment, the immersion liquid may be water.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure configured to confine immersion liquid to a space adjacent a substrate and/or a movable table, the fluid handling structure comprising:
   an exhaust opening configured to exhaust at least liquid from the space;
   a first gas supply opening outwards, relative to a central portion of the fluid handling structure, of the exhaust opening, the first gas supply opening configured to supply gas to a region between the fluid handling structure and the substrate and/or movable table;
   a second gas supply opening outwards, relative to the central portion of the fluid handling structure, of the first gas supply opening, the second gas supply opening configured to supply gas to the region; and
   a control system configured to change a gas flow parameter of the gas flow through the first gas supply opening to different non-zero values for different movements of the substrate and/or movable table relative to the fluid handling structure and to provide different gas parameter values between gas supplied from the first and second gas supply openings.

2. The fluid handling structure of claim 1, wherein the gas flow parameter comprises gas flow rate and the control system is configured to provide different gas flow rate values for different movements of the substrate and/or movable table relative to the fluid handling structure.

3. The fluid handling structure of claim 2, wherein the control system is configured to provide a first gas flow rate of gas through the first gas supply opening for movement of the substrate and/or movable table with a component of motion in a first direction relative to the fluid handling structure and configured to provide a second gas flow rate of gas through the first gas supply opening different than the first gas flow rate for movement of the substrate and/or movable table with a component of motion in a second direction relative to the fluid handling structure, the second direction being reverse to the first direction.

4. The fluid handling structure of claim 1, wherein, when the substrate and/or movable table is under the second gas supply opening, the second gas supply opening is at a different vertical distance from the substrate and/or movable table than the exhaust opening.

5. The fluid handling structure of claim 1, further comprising a further exhaust opening outwards, relative to the central portion of the fluid handling structure, of the first and/or second gas supply opening, the further exhaust opening configured to exhaust fluid from the region.

6. The fluid handling structure of claim 1, wherein the control system is further configured to substantially balance a gas flow rate through the first gas supply opening and the exhaust opening for at least one of the movements.

7. A lithographic apparatus, comprising a projection system configured to project a beam of radiation onto the substrate and comprising the fluid handling structure of claim 1.

8. A device manufacturing method, comprising:
providing an immersion liquid to a space between a final element of a projection system and a substrate and/or movable table;
exhausting at least immersion liquid from the space through an exhaust opening of a fluid handling structure;
supplying gas to a region between the fluid handling structure and the substrate and/or movable table via a first gas supply opening, the first gas supply opening located outwards, relative to a central portion of the fluid handling structure, of the exhaust opening;
supplying gas to the region via a second gas supply opening, the second gas supply opening located outwards, relative to the central portion of the fluid handling structure, of the first gas supply opening;
changing a gas flow parameter of gas flow through the first gas supply opening to different non-zero values for different movements of the substrate and/or movable table relative to the fluid handling structure; and
providing different gas parameter values between gas supplied from the first and second gas supply openings.

9. The method of claim 8, wherein the gas flow parameter comprises gas flow rate and the changing the gas flow parameter comprises providing different gas flow rates for different movements of the substrate and/or movable table relative to the fluid handling structure.

10. The method of claim 9, wherein the changing comprises providing a first gas flow rate of gas through the first gas supply opening for movement of the substrate and/or movable table with a component of motion in a first direction relative to the fluid handling structure and providing a second gas flow rate of gas through the first gas supply opening different than the first gas flow rate for movement of the substrate and/or movable table with a component of motion in a second direction relative to the fluid handling structure, the second direction being reverse to the first direction.

11. The method of claim 8, further comprising substantially balancing a gas flow rate through the first gas supply opening and the exhaust opening for at least one of the movements.

12. The method of claim 8, further comprising exhausting fluid via a further exhaust opening outwards, relative to the central portion of the fluid handling structure, of the first gas supply opening.

13. The method of claim 12, further comprising providing, during a time where both at least liquid is removed through the exhaust opening and fluid is removed through the further exhaust opening, a non-zero gas flow rate through the further exhaust opening greater than a non-zero gas flow rate through the exhaust opening.

14. A fluid handling structure for a lithographic apparatus, the fluid handling structure configured to confine immersion liquid to a space adjacent a substrate and/or a movable table, the fluid handling structure comprising:
a first gas supply opening configured to supply gas to a region between the fluid handling structure and the substrate and/or movable table;
a second gas supply opening outwards, relative to the central portion of the fluid handling structure, of the first gas supply opening, the second gas supply opening configured to supply gas to the region; and
a control system configured to change a gas flow parameter of the gas flow through the first gas supply opening to different non-zero values for different movements of the substrate and/or movable table relative to the fluid handling structure and to provide different gas parameter values between gas supplied from the first and second gas supply openings.

15. The fluid handling structure of claim 14, wherein the gas flow parameter comprises gas flow rate and the control system is configured to provide different gas flow rate values for different movements of the substrate and/or movable table relative to the fluid handling structure.

16. The fluid handling structure of claim 15, wherein the control system is configured to provide a first gas flow rate of gas through the first gas supply opening for movement of the substrate and/or movable table with a component of motion in a first direction relative to the fluid handling structure and configured to provide a second gas flow rate of gas through the first gas supply opening different than the first gas flow rate for movement of the substrate and/or movable table with a component of motion in a second direction relative to the fluid handling structure, the second direction being reverse to the first direction.

17. The fluid handling structure of claim 14, further comprising an exhaust opening outwards, relative to the central portion of the fluid handling structure, of the first and/or second gas supply opening, the exhaust opening configured to exhaust fluid from the region.

18. The fluid handling structure of claim 14, wherein, when the substrate and/or movable table is under the first and second gas supply openings, the first and second gas supply openings are at substantially same vertical distance from the substrate and/or movable table.

19. The fluid handling structure of claim 14, wherein the first gas supply opening comprises a plurality of spaced apart apertures configured to supply gas and the second gas supply opening comprises a plurality of spaced apart apertures configured to supply gas.

20. A lithographic apparatus, comprising a projection system configured to project a beam of radiation onto the substrate and comprising the fluid handling structure of claim 14.

* * * * *